(12) United States Patent
Kodama et al.

(10) Patent No.: US 10,098,269 B2
(45) Date of Patent: Oct. 9, 2018

(54) MANUFACTURE WORK MACHINE FOR CONTROLLING A PLURALITY OF WORK-ELEMENT PERFORMING APPARATUSES BY CENTRAL CONTROL DEVICE

(75) Inventors: Seigo Kodama, Yatomi (JP); Noriaki Iwaki, Hekiman (JP); Kazuya Furukawa, Chiryu (JP); Takashi Ito, Toyota (JP); Hideyuki Tsutsumi, Kariya (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 175 days.

(21) Appl. No.: 13/643,437

(22) PCT Filed: Mar. 29, 2011

(86) PCT No.: PCT/JP2011/057812
§ 371 (c)(1),
(2), (4) Date: Oct. 31, 2012

(87) PCT Pub. No.: WO2011/135960
PCT Pub. Date: Nov. 3, 2011

(65) Prior Publication Data
US 2013/0046402 A1 Feb. 21, 2013

(30) Foreign Application Priority Data

Apr. 29, 2010 (JP) .................................. 2010-104661
May 28, 2010 (JP) .................................. 2010-122483
(Continued)

(51) Int. Cl.
G05D 3/00 (2006.01)
H05K 13/04 (2006.01)
(Continued)

(52) U.S. Cl.
CPC ......... H05K 13/04 (2013.01); G05B 19/0421 (2013.01); G05B 19/41805 (2013.01);
(Continued)

(58) Field of Classification Search
None
See application file for complete search history.

(56) References Cited

U.S. PATENT DOCUMENTS 3,576,540 A * 4/1971 Fair ........................ B23Q 41/00
198/341.03
4,161,064 A 7/1979 Woodman, Jr. et al.
(Continued)

FOREIGN PATENT DOCUMENTS

CN 1714611 A 12/2005
CN 1799299 A 7/2006
(Continued)

OTHER PUBLICATIONS

Oct. 20, 2014 Office Action issued in Chinese Application No. 201180021362.3.
(Continued)

Primary Examiner — Emilio J Saavedra
(74) Attorney, Agent, or Firm — Oliff PLC

(57) ABSTRACT

A manufacture work machine for preforming a manufacture work, including: work-element performing apparatuses each configured to perform one of work elements of the manufacture work, and a central control device to control the apparatuses in a centralized manner, such that motion commands for one motion to be performed by one of the apparatuses are sequentially transmitted, wherein each apparatus has an individual control device to control an operation of said each apparatus and at least one operating device for performing a work element corresponding to said each apparatus, and wherein the individual control device is
(Continued)

configured to recognize a matter of the motion command transmitted from the central control device and is configured to control an operation of each of the at least one operating device so as to permit one of the apparatuses to which the individual control device belongs to perform one motion corresponding to the motion command.

10 Claims, 16 Drawing Sheets

(30) Foreign Application Priority Data

May 28, 2010 (JP) ................................. 2010-122484
Jun. 1, 2010 (JP) ................................. 2010-125545

(51) Int. Cl.
G05B 19/042 (2006.01)
G05B 19/418 (2006.01)

(52) U.S. Cl.
CPC ... *G05B 19/41865* (2013.01); *H05K 13/0495* (2013.01); *G05B 2219/31421* (2013.01); *G05B 2219/32283* (2013.01); *G05B 2219/34418* (2013.01); *G05B 2219/36195* (2013.01); *G05B 2219/45026* (2013.01); *Y10T 29/51* (2015.01)

(56) References Cited

U.S. PATENT DOCUMENTS

| | | | |
|---|---|---|---|
| 4,790,069 A | 12/1988 | Maruyama et al. | |
| 4,926,375 A * | 5/1990 | Mercer | H04L 29/00 370/432 |
| 5,262,954 A | 11/1993 | Fujino et al. | |
| 5,949,673 A * | 9/1999 | Struger | G05B 15/02 700/2 |
| 5,960,534 A | 10/1999 | Yazawa et al. | |
| 6,161,277 A | 12/2000 | Asai et al. | |
| 6,216,046 B1 | 4/2001 | Huber et al. | |
| 6,708,385 B1 * | 3/2004 | Lemelson | B23Q 41/06 29/563 |
| 6,718,629 B1 | 4/2004 | Stanzl | |
| 6,788,990 B1 | 9/2004 | Yanaru et al. | |
| 6,876,896 B1 * | 4/2005 | Ortiz | B29C 65/02 318/135 |
| 6,948,232 B1 | 9/2005 | Yazawa et al. | |
| 7,289,867 B1 | 10/2007 | Markle et al. | |
| 2003/0093254 A1 * | 5/2003 | Frankel | H04L 43/50 703/13 |
| 2003/0135991 A1 | 7/2003 | Nagao et al. | |
| 2004/0117983 A1 | 6/2004 | Beck et al. | |
| 2006/0017765 A1 * | 1/2006 | Sato | B41J 29/393 347/19 |
| 2006/0085973 A1 * | 4/2006 | Kodama | H05K 13/04 29/740 |
| 2006/0131156 A1 * | 6/2006 | Voelckers | G06F 3/0234 200/512 |
| 2006/0179645 A1 | 8/2006 | Chikuma et al. | |
| 2006/0207090 A1 | 9/2006 | Kawada | |
| 2006/0224265 A1 | 10/2006 | Nakayama et al. | |
| 2007/0089113 A1 | 4/2007 | Kobayashi | |
| 2007/0296826 A1 | 12/2007 | Kimura | |
| 2008/0158596 A1 * | 7/2008 | Kadota | G03G 15/5004 358/1.15 |
| 2009/0049207 A1 * | 2/2009 | Reynolds | H04L 12/40013 710/16 |
| 2009/0125656 A1 * | 5/2009 | Haas | H04L 29/12009 710/104 |
| 2010/0131078 A1 * | 5/2010 | Brown | G05B 19/042 700/17 |
| 2010/0131081 A1 | 5/2010 | Brown et al. | |
| 2011/0058107 A1 * | 3/2011 | Sun | G06F 3/017 348/734 |
| 2011/0156898 A1 * | 6/2011 | Taillefer | G08B 1/08 340/539.11 |
| 2014/0277683 A1 * | 9/2014 | Gupta | G06F 17/50 700/132 |

FOREIGN PATENT DOCUMENTS

| | | |
|---|---|---|
| CN | 1835676 A | 9/2006 |
| CN | 101094322 A | 12/2007 |
| DE | 4016033 A1 | 11/1991 |
| EP | 0456218 A2 | 11/1991 |
| EP | 1426842 A2 | 6/2004 |
| JP | S58-175894 A | 10/1983 |
| JP | A-61-39134 | 2/1986 |
| JP | H02-288393 A | 11/1990 |
| JP | A-3-167895 | 7/1991 |
| JP | A-4-172504 | 6/1992 |
| JP | A-5-46631 | 2/1993 |
| JP | H06-008078 A | 1/1994 |
| JP | H06-67709 A | 3/1994 |
| JP | A-6-95729 | 4/1994 |
| JP | H06-318104 A | 11/1994 |
| JP | H07-060577 | 3/1995 |
| JP | A-10-105494 | 4/1998 |
| JP | H11-039018 A | 2/1999 |
| JP | A-11-204998 | 7/1999 |
| JP | H11-179682 A | 7/1999 |
| JP | A-2000-035809 | 2/2000 |
| JP | 2001-203500 A | 7/2001 |
| JP | A-2001-255912 | 9/2001 |
| JP | A-2003-5809 | 1/2003 |
| JP | 2003-086654 A | 3/2003 |
| JP | 2004-006938 A | 1/2004 |
| JP | A-2004-6512 | 1/2004 |
| JP | 2004-506319 A | 2/2004 |
| JP | A-2004-104075 | 4/2004 |
| JP | 2004-221518 A | 8/2004 |
| JP | A-2004-265946 | 9/2004 |
| JP | A-2004-280305 | 10/2004 |
| JP | A-2004-319662 | 11/2004 |
| JP | A-2006-261325 | 9/2006 |
| JP | A-2007-98553 | 4/2007 |
| JP | 2007-129130 A | 5/2007 |
| JP | A-2007-129130 | 5/2007 |
| JP | A-2001-320159 | 6/2007 |
| JP | A-2007-158213 | 6/2007 |
| JP | A-2008-60250 | 3/2008 |
| JP | A-2008-153707 | 7/2008 |
| JP | 2008-229738 A | 10/2008 |
| JP | 2008-270322 A | 11/2008 |
| JP | 2009-105351 A | 5/2009 |
| JP | A-2009-123895 | 6/2009 |
| JP | 2009-172689 A | 8/2009 |
| JP | 2009-272651 A | 11/2009 |
| WO | 2004/047512 A1 | 6/2004 |

OTHER PUBLICATIONS

Nov. 18, 2014 Office Action issued in Japanese Application No. 2014-007549.
May 17, 2011 International Search Report issued in International Patent Application No. PCT/JP2011/057812.
Dec. 10, 2012 International Preliminary Report on Patentability issued in International Patent Application No. PCT/JP2011/057812 (with translation).
Office Action issued in Japanese Patent Application No. 2010-122484 dated Feb. 6, 2014 (with translation).
Jul. 28, 2014 Office Action issued in Chinese Application No. 201180021080.3 (with translation).
Aug. 26, 2014 Office Action issued in Japanese Application No. 2010-122483 (with translation).
Dec. 20, 2012 International Preliminary Report on Patentability issued in International Patent Application No. PCT/JP2011/057815.
May 17, 2011 International Search Report issued in Patent Application No. PCT/JP2011/057815.

(56) References Cited

OTHER PUBLICATIONS

International Search Report issued in International Patent Application No. PCT/JP2011/057816 dated May 17, 2011.
Written Opinion issued in International Patent Application No. PCT/JP2011/057816 dated May 17, 2011.
International Preliminary Report on Patentability issued in International Patent Application No. PCT/JP2011/057816 dated Dec. 10, 2012.
Apr. 12, 2011 International Search Report issued in International Application No. PCT/JP2011/056060 (with translation).
Nov. 19, 2013 Office Action issued in Japanese Application No. 2010-122484 (with English translation).
Nov. 19, 2013 Office Action issued in Japanese Application No. 2010-125545 (with English translation).
Nov. 12, 2013 Office Action issued in Japanese Application No. 2010-104661 (with English translation).
U.S. Appl. No. 13/641,637 in the name of Kodama et al., filed Oct. 16, 2012.
U.S. Appl. No. 13/643,437 in the name of Kodama et al., filed Oct. 31, 2012.
U.S. Appl. No. 13/643,398 in the name of Kodama et al., filed Oct. 31, 2012.
Oct. 10, 2014 Office Action issued in Chinese Application No. 201180021073.3.
U.S. Appl. No. 13/643,347, filed Oct. 31, 2012 in the name of Iwaki et al.
Office Action issued in Japanese Patent Application No. 2010-122483 dated Jan. 21, 2014 (with translation).
Office Action issued in Japanese Patent Application No. 2010-104661 dated Jan. 28, 2014 (with translation).
Office Action issued in Japanese Patent Application No. 2010-104661 dated Jun. 24, 2014 (with translation).
U.S. Appl. No. 13/643,343 in the name of Iwaki et al.
Office Action issued in Chinese Application No. 201180021302.1 dated Aug. 5, 2014 (with translation).
Report of Reconsideration by Examiner before Appeal issued in Japanese Application No. 2010-122484 dated Sep. 3, 2014 (with translation).
International Preliminary Report on Patentability issued in International Application No. PCT/JP2011/056060 dated Dec. 10, 2012.
Nov. 10, 2015 Office Action cited in Japanese Patent Application No. 2014-090948.
Dec. 2, 2015 Office Action issued in U.S. Appl. No. 13/643,398.
Sep. 1, 2015 Office Action issued in Japanese Patent Application No. 2014-212430.
Dec. 16, 2014 Office Action issued in Japanese Patent Application No. JP2014-008009.
Jan. 23, 2015 Office Action issued in U.S. Appl. No. 13/641,637.
Jan. 8, 2015 Office Action issued in U.S. Appl. No. 13/643,347.
Jun. 30, 2015 Office Action issued in Japanese Patent Application No. 2014-083338.
Dec. 24, 2014 Office Action issued in Japanese Application No. 2014-083338.
Jan. 6, 2015 Office Action issued in Japanese Application No. 2014-055980.
Jul. 29, 2015 Office Action issued in U.S. Appl. No. 13/643,347.
Mar. 29, 2016 Office Action cited in Japanese Patent Application No. 2014-212430.
Apr. 4, 2017 Office Action issued in Japanese Patent Application No. 2016-123576.
Apr. 5, 2017 Extended European Search Report issued in European Patent Application No. 11 774 745.1.
Apr. 5, 2017 Extended European Search Report issued in European Patent Application No. 11 774 744.4.
Mar. 21, 2017 Extended European Search Report issued in European Application 11774746.9.
Mar. 3, 2015 Office Action issued in Japanese Patent Application No. 2014-055981.
Mar. 24, 2015 Office Action issued in Japanese Patent Application No. 2014-090948.
Jul. 17, 2017 Extended European Search Report issued in European Patent Application No. 11774722.0.
Feb. 7, 2018 Office Action issued in Chinese Patent Application No. 201510547772.1.
Aug. 1, 2017 Office Action issued in Chinese Patent Application No. 201510547772.1.
May 8, 2015 Office Action issued in U.S. Appl. No. 13/643,347.
May 8, 2015 Office Action issued in U.S. Appl. No. 13/643,398.
Jun. 28, 2018 Office Action issued in European Patent Application No. 11 774 746.9.

\* cited by examiner

FIG.3
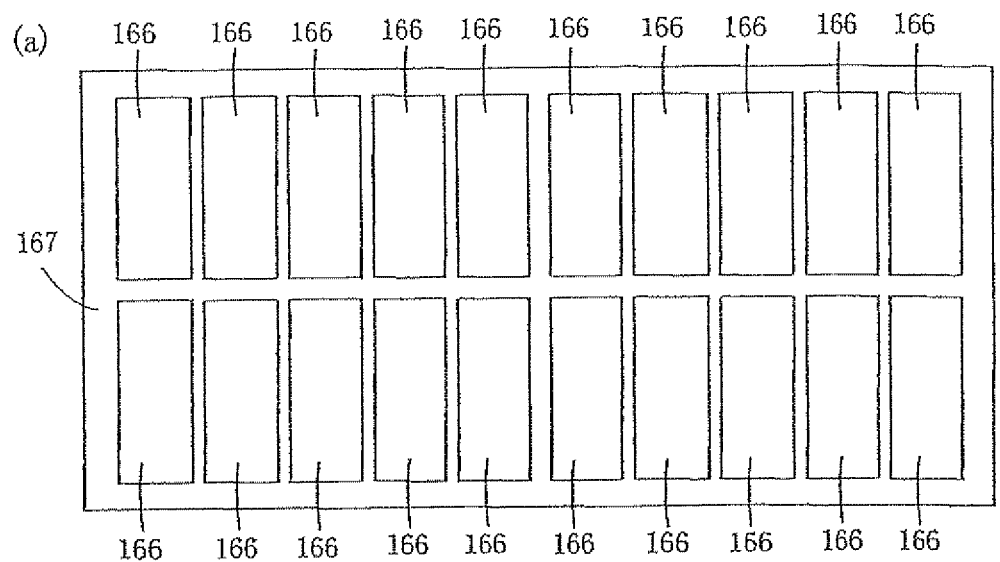
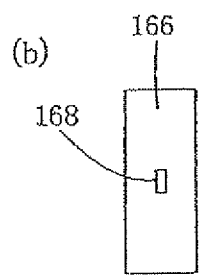
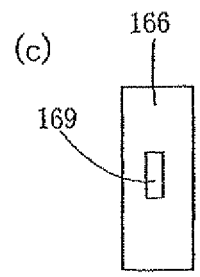

FIG.4

| BASIC CODE No. | BASIC CODE |
|---|---|
| (1) | PREPARATION WORK |
| (2) | SUBSTRATE-RELATED WORK |
| (3) | SUBSTRATE-RELATED WORK |
| (4) | SUBSTRATE-RELATED WORK |
| (5) | SUBSTRATE-RELATED WORK |
| (6) | SUBSTRATE-RELATED WORK |
| (7) | SUBSTRATE-RELATED WORK |
| (8) | SUBSTRATE-RELATED WORK |
| OMITTED ||
| (19) | SUBSTRATE-RELATED WORK |
| (20) | SUBSTRATE-RELATED WORK |
| (21) | SUBSTRATE-RELATED WORK |
| (22) | FINISHING WORK |

FIG.5

| PREPARATION WORK | |
|---|---|
| UNIT-WORK CODE No. | UNIT-WORK CODE |
| (1) | TRAY PREPARATION |

| SUBSTRATE-RELATED WORK | |
|---|---|
| UNIT-WORK CODE No. | UNIT-WORK CODE |
| (1) | SUBSTRATE-INFORMATION OBTAINING |
| (2) | ADHESIVE APPLICATION |
| (3) | COMPONENT MOUNTING |

| FINISHING WORK | |
|---|---|
| UNIT-WORK CODE No. | UNIT-WORK CODE |
| (1) | TRAY SEND-OUT |

FIG.6

| TRAY PREPARATION | |
|---|---|
| MOTION CODE No. | MOTION CODE |
| (1) | CONVEYOR: CONVEYANCE |
| (2) | SUPPLIER: SUPPLY |

| COMPONENT MOUNTING | |
|---|---|
| MOTION CODE No. | MOTION CODE |
| (1) | MOVING DEVICE: MOVEMENT |
| (2) | MOUNTER: HOLDING |
| (3) | MOVING DEVICE: MOVEMENT |
| (4) | BASE CAMERA: IMAGE TAKING |
| (5) | MOVING DEVICE: MOVEMENT |
| (6) | MOUNTER: SEPARATION |

| SUBSTRATE-INFORMATION OBTAINING | |
|---|---|
| MOTION CODE No. | MOTION CODE |
| (1) | MOVING DEVICE: MOVEMENT |
| (2) | HEAD CAMERA: IMAGE TAKING |

| TRAY SEND-OUT | |
|---|---|
| MOTION CODE No. | MOTION CODE |
| (1) | CONVEYOR: CONVEYANCE |

| ADHESIVE APPLICATION | |
|---|---|
| MOTION CODE No. | MOTION CODE |
| (1) | MOVING DEVICE: MOVEMENT |
| (2) | DISPENSER: EJECTION |

FIG.7

| MOTION COMMAND No. | MAIN COMMAND | ASSOCIATED COMMAND | COMMAND STATE |
|---|---|---|---|
| (1) | CONVEYOR: CONVEYANCE | CONVEYANCE AMOUNT | COMMAND ISSUING OR COMMAND ABSENT |
| (2) | SUPPLIER: SUPPLY | COMPONENT TRAY No. | COMMAND ISSUING OR COMMAND ABSENT |
| (3) | MOVING DEVICE: MOVEMENT | MOVEMENT AMOUNT | COMMAND ISSUING OR COMMAND ABSENT |
| (4) | HEAD CAMERA: IMAGE TAKING | | COMMAND ISSUING OR COMMAND ABSENT |
| (5) | MOVING DEVICE: MOVEMENT | MOVEMENT AMOUNT | COMMAND ISSUING OR COMMAND ABSENT |
| (6) | DISPENSER: EJECTION | EJECTION AMOUNT | COMMAND ISSUING OR COMMAND ABSENT |
| (7) | MOVING DEVICE: MOVEMENT | MOVEMENT AMOUNT | COMMAND ISSUING OR COMMAND ABSENT |
| (8) | MOUNTER: HOLDING | | COMMAND ISSUING OR COMMAND ABSENT |
| (9) | MOVING DEVICE: MOVEMENT | MOVEMENT AMOUNT | COMMAND ISSUING OR COMMAND ABSENT |
| (10) | BASE CAMERA: IMAGE TAKING | | COMMAND ISSUING OR COMMAND ABSENT |
| (11) | MOVING DEVICE: MOVEMENT | MOVEMENT AMOUNT | COMMAND ISSUING OR COMMAND ABSENT |
| (12) | MOUNTER: SEPARATION | | COMMAND ISSUING OR COMMAND ABSENT |
| (13) | MOVING DEVICE: MOVEMENT | MOVEMENT AMOUNT | COMMAND ISSUING OR COMMAND ABSENT |
| (14) | HEAD CAMERA: IMAGE TAKING | | COMMAND ISSUING OR COMMAND ABSENT |
| (15) | MOVING DEVICE: MOVEMENT | MOVEMENT AMOUNT | COMMAND ISSUING OR COMMAND ABSENT |
| (16) | DISPENSER: EJECTION | EJECTION AMOUNT | COMMAND ISSUING OR COMMAND ABSENT |
| (17) | MOVING DEVICE: MOVEMENT | MOVEMENT AMOUNT | COMMAND ISSUING OR COMMAND ABSENT |
| (18) | MOUNTER: HOLDING | | COMMAND ISSUING OR COMMAND ABSENT |
| (19) | MOVING DEVICE: MOVEMENT | MOVEMENT AMOUNT | COMMAND ISSUING OR COMMAND ABSENT |
| (20) | BASE CAMERA: IMAGE TAKING | | COMMAND ISSUING OR COMMAND ABSENT |
| OMITTED | | | |
| (199) | MOVING DEVICE: MOVEMENT | MOVEMENT AMOUNT | COMMAND ISSUING OR COMMAND ABSENT |
| (200) | BASE CAMERA: IMAGE TAKING | | COMMAND ISSUING OR COMMAND ABSENT |
| (201) | MOVING DEVICE: MOVEMENT | MOVEMENT AMOUNT | COMMAND ISSUING OR COMMAND ABSENT |
| (202) | MOUNTER: SEPARATION | | COMMAND ISSUING OR COMMAND ABSENT |
| (203) | CONVEYOR: CONVEYANCE | CONVEYANCE AMOUNT | COMMAND ISSUING OR COMMAND ABSENT |

FIG.8

| OPERATION RESULT | COMMAND STATE | STATE OF WORK-ELEMENT PERFORMING APPARATUS |

MANUFACTURE WORK MACHINE FOR CONTROLLING A PLURALITY OF WORK-ELEMENT PERFORMING APPARATUSES BY CENTRAL CONTROL DEVICE

TECHNICAL FIELD

The present invention relates to a manufacture work machine configured to perform a manufacture work by a plurality of work-element performing apparatuses.

BACKGROUND ART

As a manufacture work machine for performing a manufacture work, there is known a manufacture work machine which includes a plurality of work-element performing apparatuses each configured to perform one of a plurality of work elements that constitute the manufacture work. The known manufacture work machine is configured to perform the manufacture work by controlling the plurality of work-element performing apparatuses by means of a central control device. The following Patent Literature describes a robot system in which each of a plurality of robots has an individual control device for controlling an operation of a corresponding one of the robots on the basis of a motion command transmitted from the central control device.

CITATION LIST

Patent Literature

[Patent Literature 1] JP-A-2007-98553

SUMMARY OF INVENTION

Technical Problem

Like the robot system described in the above Patent Literature, the manufacture work machine may be configured such that each of a plurality of work-element performing apparatuses has an individual control device for controlling an operation of a corresponding one of the work-element performing apparatuses on the basis of a motion command transmitted from the central control device. In the thus configured manufacture work machine, in association with a change of the manufacture work, for instance, one of the plurality of work-element performing apparatuses may be replaced with another work-element performing apparatus, and said another work-element performing apparatus may be controlled by transmitting the motion command thereto. That is, the central control device may be used as a general-purpose device, and the work-element performing apparatus as a special-purpose apparatus may be changed depending upon purposes. However, techniques as to the transmission of the motion command by the central control device and the control of the work-element performing apparatus based on the transmitted motion command are still devoid of concreteness, and improvements can be made in various aspects. Therefore, there is a plenty of room for improving practical utility. The present invention has been made in view of the above. It is therefore an object of the invention to enhance practical utility of the manufacture work machine in which the work-element performing apparatuses are exchangeable depending upon purposes

Solution to Problem

To solve the problem described above, a manufacture work machine according to the present invention is configured such that each of a plurality of work-element performing apparatuses includes: an individual control device configured to control an operation thereof; and at least one operating device for performing a work element corresponding to each of the plurality of work-element performing apparatuses and such that the individual control device recognizes a matter of a motion command transmitted from a central control device and controls an operation of each of the at least one operating device so as to permit a corresponding one of the plurality of work-element performing apparatuses to which the individual control device belongs to perform one motion corresponding to the motion command.

Advantageous Effects of Invention

A considerably large number of programming languages are currently used, and the programming languages used in the respective work-element performing apparatuses often differ from each other. Accordingly, the programming languages which define a plurality of motion commands to be transmitted from the central control device often differ from each other so as to correspond to the respective work-element performing apparatuses to which the motion commands are to be transmitted. In the manufacture work machine according to the present invention, the individual control device of each of the work-element performing apparatuses is configured to recognize the matter (details) of the motion command transmitted from the central control device and to control the operation of the operating device on the basis of the recognized motion command. According to the manufacture work machine of the present invention, it is not necessary to change the programming languages that define the motion commands to be transmitted to the respective work-element performing apparatuses, depending upon the work-element performing apparatuses. In other words, it is possible to improve a transmission technique of the motion commands by the central control device and to accordingly enhance practical utility of the manufacture work machine. In the present description, "programming language" is not limited to typical programming languages such as a ladder language and a C language, but is an antonym of a machine language and is used for generating or forming an instruction for permitting a computer to perform some work. That is, where the computer is configured to operate according to an instruction formed by a specific rule, the language used for forming the instruction corresponds to the "programming language" in the present description.

Forms of Invention

There will be explained various forms of an invention which is considered claimable (hereinafter referred to as "claimable invention" where appropriate). Each of the forms is numbered like the appended claims and depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following description of various forms and embodiments. It is to be further understood that any form in which one or more constituent elements is/are added to or deleted from any one of the following forms may be considered as one form of the claimable invention.

Each of the following forms (1) and (2) indicates a structure based on which the claimable invention is made. Each of forms in which the technical features of any of the following forms (11)-(61) are added to the form (1) or (2) may be forms of the claimable invention. In this respect, a form m which the technical features of (41), (42), and (43) are added to the form (1) corresponds to claim 1. A form in which the technical features of the form (44) is added to claim 1 corresponds to claim 2. A form in which the technical features of the forms (12) and (13) are added, to claim 1 or 2 corresponds to claim 3. A form in which the technical features of the form (45) is added to any one of claims 1-3 corresponds to claim 4. A form in which the technical features of the form (48) are added to claim 4 corresponds to claim 5. A form in which the technical features of the form (51) is added to any one of claims 1-5 corresponds to claim 6. A form in which the technical features of the form (15) is added to any one of claims 1-6 corresponds to claim 7.

(1) A manufacture work machine for performing a manufacture work, comprising:

a plurality of work-element performing apparatuses each configured to perform one of a plurality of work elements that constitute the manufacture work, and a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses.

(2) A central control device used in a manufacture work machine for performing a manufacture work to control, in a centralized manner, a plurality of work-element performing apparatuses configured to perform one of a plurality of work elements that constitute the manufacture work, by sequentially transmitting a plurality of motion commands each of which is a command for one motion to be performed by one of the plurality of work-element performing apparatuses.

Each of the above two forms is a basis on which the claimable invention is made. In the former form, basic constituent elements of the manufacture work machine according to the claimable invention are listed. In the latter form, basic constituent elements of the central control device according to the claimable invention are listed. The "manufacture work" described in the above two forms, namely, a target work of the present manufacture work machine, is not particularly limited, but may include an assembling work of assembling a plurality of components (parts) into an assembled article and various works in which certain processing, treatment or the like is performed on a work object (which is a concept that includes "component (part)", "assembled article", "object to be processed or treated", etc.). More specifically, as the work to perform certain processing, a work, such as a press work, in which the work object is deformed, a work, such as a cut-off work, in which a part of the work object is cut off, and a work, such as a cutting work, in which the work object is shaped, may be the target work, for instance. As the work to perform a certain treatment, a surface modification work in which a surface of the work object is modified by laser, plasma or the like, a coating work in which an adhesive, a coloring agent or the like is applied to the work object, a heat treatment work in which the work object is heated and cooled, and a surface finishing work such as grinding, may be the target work, for instance. Further, an inspection work of inspecting work results of the assembling work and the works in which certain processing, treatment or the like is performed may be the target work.

The "work element" described in each of the above two forms means one of a movement, rotation, a posture change, a treatment, processing and the like, to be performed on the work object, for instance. One manufacture work is performed by coordination of those work elements. The kind and the number of the work elements and the manner of coordination vary depending upon the target work. The "work-element performing apparatus" is an apparatus for performing one work element and may be considered as an apparatus having a single function in accordance with the work element, for instance. More specifically, where the target work is the assembling work, for instance, each of the following (a)-(d) is incorporated as the work-element performing apparatus into the manufacture work machine: (a) a conveyor configured to perform conveyance for conveying one component from an outside of the manufacture work machine and for conveying the assembled article out of the manufacture work machine; (b) a component supplier configured to supply another component; (c) a work head configured to hold another component supplied by the component supplier for attachment to the one component; and (d) a head moving device configured to move the work head that holds the component for moving the component. In the assembling work or in the inspection work for inspecting the result of the assembling work, an image taking device such as a camera for taking an image of the component or the assembled article to recognize the position and the posture thereof, the assembling accuracy, etc., may be the work-element performing apparatus configured to perform image taking processing as the work element. In the assembling work, an adhesive applier for applying an adhesive to at least one of the two components for bonding thereof may be the work-element performing apparatus configured to perform adhesive application as the work element. Further, the device configured to perform laser processing or plasma processing may be the work-element performing apparatus in the manufacture work in which the laser processing or the plasma processing is performed.

(11) The manufacture work machine according to the form (1) or the central control device according to the form (2), wherein the manufacture work machine is configured such that at least one of the plurality of work-element performing apparatuses is configured to be exchangeable with other work-element performing apparatuses except the plurality of work-element performing apparatuses.

According to this form, the central control device is used as the general-purpose device, and the work-element performing apparatuses each as the special-purpose apparatus are exchangeable depending upon purposes. Accordingly, it is possible to decrease a cost and a time required in development and production of the manufacture work machine,

(12) The manufacture work machine or the central control device according to any one of the forms (1)-(11), wherein the central control device includes a central interface section for transmitting, according to one protocol, a motion command to each of the plurality of work-element performing apparatuses.

(13) The manufacture work machine or the central control device according to the form (12), wherein each of the plurality of work-element performing apparatuses includes an individual control device configured to control an operation thereof, and wherein the individual control device includes an individual interface section for receiving, according to the one protocol, the motion command transmitted from the central control device.

When one work-element performing apparatus of the manufacture work machine is replaced with another work-element performing apparatus, communication protocol sometimes needs to be changed such that the central control device transmits the motion command that conforms to another work-element performing apparatus, and the replacement of the work-element performing apparatus requires a great deal of labor. According to the above two forms, it is not needed to change the communication protocol when the work-element performing apparatus is replaced, thereby reducing the load required in the replacement of the work-element performing apparatus. The "protocol" described in the above two forms is for defining an agreement, a procedure, a rule or the like as to communication between the central control device and the individual control device. The "protocol" in the above two forms includes not only an agreement of communication data itself, but also an agreement of a transmission path of data or the like between the central control device and the individual control device, more specifically, an agreement of the kind of cables and connectors in wired communication and an agreement of frequency hands in wireless communication.

(14) The manufacture work machine or the central control device according to the form (13), wherein the manufacture work machine includes a plurality of communication cables which respectively correspond to the plurality of work-element performing apparatuses and each of which connects the central interface section of the central control device and the individual interface section of a corresponding one of the plurality of work-element performing apparatuses, and wherein the plurality of communication, cables are the same in kind.

In this form, an interface between the individual control device of each of the plurality of work-element performing apparatuses and the central control device is unified, and an input/output port is unified. According to this form, it is possible to easily carry out replacement of the work-element performing apparatus.

(15) The manufacture work machine or the central control device according to any one of the forms (1)-(14), wherein the manufacture work machine is an assembling work machine configured to assemble a plurality of components into an assembled article, wherein the plurality of work-element performing apparatuses include:

a conveyor configured to perform conveyance of at least one of a first component which is one of the plurality of components and the assembled, article, as one of the plurality of work elements, a component supplier configured to perform supply of a second component which is the other one of the plurality of components, as another one of the plurality of work elements, and a work head configured to perform a motion necessary for assembling the second component to the first component, as still another one of the plurality of work elements.

In this form, the work-element performing apparatus is concretely limited. The "plurality of work-element performing apparatuses" described in this form may include at least one of: (a) a treatment•processing head configured to perform, as the work element, treatment•processing necessary prior to or after assembling of the second component to the first component; (b) a camera device configured to perform as the work element, image taking of at least one of the first component and the second component to obtain information necessary for assembling of the second component to the first component; and (c) a moving device configured to perform, as the work element, a movement of the work head, the treatment•processing head, or the camera device, for changing a position at which the work element by the work head, the treatment•processing head, or the camera device is performed.

(16) The manufacture work machine or the central control device according to any one of the forms (1)-(15), wherein the manufacture work machine includes a base, and each of the plurality of work-element performing apparatuses is configured to be attachable to and detachable from one of the base and another one of the plurality of work-element performing apparatuses except itself.

In this form, it is preferable that the work-element performing apparatus be easily attached to and detached from the base or another work-element performing apparatus for easy replacement of the work-element performing apparatus. To be more specific, it is preferable that the work-element performing apparatus be attachable to and detachable from the base or another work-element performing apparatus by fastening action with several bolts, etc., or by one-touch action, for instance.

(17) The manufacture work machine or the central control device according to any one of the forms (1)-(16), wherein each of the plurality of work-element performing apparatuses possesses identification information for identification thereof, and wherein the central control device includes a work-element-performing-apparatus identifying section configured to judge, on the basis of the identification information obtained from each of the plurality of work-element performing apparatuses, whether a motion command can be transmitted to said each of the plurality of work-element performing apparatuses.

Where the work-element performing apparatus is exchangeable, there is a concern that the work-element performing apparatus is produced and sold by a third party who is not qualified by a producer of the manufacture work machine. According to this form, it is possible to render a work-element performing apparatus manufactured by the non-qualified third party invalid, thereby preventing distribution of the work-element performing apparatus produced by the non-qualified third party.

(21) The manufacture work machine or the central control device according to any one of the forms (1)-(17), wherein the central control device includes:

a source-data storage section configured to store source data in which is encoded a matter of each of the plurality of work elements to be performed by each of the plurality of work-element performing apparatuses to perform the manufacture work, a motion-command generating section configured to generate the plurality of motion commands on the basis of the source data, and a command-transmission processing section configured to perform transmission processing to transmit the plurality of motion commands generated by the motion-command generating section to the plurality of work-element performing apparatuses.

The number of motion commands to be transmitted to the plurality of work-element performing apparatuses is comparatively large. Where matters (details) of the manufacture work are complicated, the number is considerably large, thereby taking a great deal of trouble for generating the motion commands. More specifically, the motion command corresponds to one motion to be performed by one work-element performing apparatus. Accordingly, where a specific number of motions, e.g., one hundred motions, each of which is performed by one work-element performing apparatus, are necessary in the manufacture work, the specific number of motion commands, namely, one hundred motion commands, are necessary. In this form, the "source data" is encoded. Accordingly, by putting techniques in encoding into full use, the source data can be made comparatively simple, whereby trouble for generating the motion commands can be reduced according to this form.

While the "source data" described in this form may be encoded in any structure, it is preferable that the source data be encoded in a structure in which repetition is avoided, such as a hierarchical structure, a subroutine structure, or a module structure. The "motion-command generating section" described in this form may be configured not only to merely generate the plurality of motion commands, but also to generate the plurality of motion commands so as to be arranged in order in which the motion commands are transmitted to each of the plurality of work-element performing apparatuses. Where the motion-command generating section is thus configured, it is possible to construct the "command-transmission processing section" in this form so as to transmit the motion commands in the arranged order, so that the "command-transmission processing section" can be formed as a functional section in which the necessity to execute complicated processing is low.

(22) The manufacture work machine or the central control device according to the form (21), wherein the central control device includes a source-data-input accepting section configured to accept input of the source data to be stored in the source-data storage section, from an exterior.

Where the manufacture work which is performed in the manufacture work machine is changed, the source data also needs to be changed. According to this form, it is possible to easily change the source data, thereby easily dealing with change of the manufacture work.

(23) The manufacture work machine or the central control device according to the form (21) or (22), wherein the source data is encoded according to a structured programming technique.

The "structured programming technique" described in this form is a technique of describing, in stepwise, the work for performing the manufacture work into detailed units. More specifically, the structured programming technique is a technique of dividing the manufacture work into several rough units and further dividing each of several units into particulars. Accordingly, this form enables the source data to be encoded in the hierarchical structure, the sub routine structure or the like, whereby the source data can be made comparatively simple.

(24) The manufacture work machine or the central control device according to any one of the forms (21)-(23), wherein the source data has a structure in which a plurality of unit-work codes and a plurality of motion-code groups each of which is associated to one of the plurality of unit-work codes are hierarchical.

In this form, the source data is concretely limited. The "source data" described in this form needs to have a hierarchical structure having at least two levels including the unit work codes and the motion-code groups. The source data may have a hierarchical structure having three or more levels. More specifically, the source data may have a structure having a superordinate code of the unit-work codes in which at least one of the plurality of unit works is collectively encoded.

(25) The manufacture work machine or the central control device according to the form (24), wherein the manufacture work is constituted by a plurality of unit works each composed of a series of plurality of motions to be performed by at least one of the plurality of work-element performing apparatuses, wherein the plurality of unit-work codes correspond to the plurality of unit works and each of the plurality of unit-work codes indicates one of the plurality of unit works, and wherein each of the plurality of motion-code groups indicates the series of plurality of motions which is to be performed by the at least one of the plurality of work-element performing apparatuses and which constitute one of the plurality of unit works indicated by an associated one of the plurality of unit-work codes.

In this form, the unit-work code and the motion-code group are concretely limited. The "unit work" described in this form is obtained by dividing the manufacture work such that the motions performed by the respective work-element performing apparatuses are successive and is constituted by a series of a plurality of motions performed by at least one of the plurality of work-element performing apparatuses. That is, the "manufacture work" described in this form may be constituted only by the plurality of unit works or may be constituted by the plurality of unit works and a plurality of single works each of which is composed of one motion performed by one work-element performing apparatus.

(26) The manufacture work machine or the central control device according to the form (25), wherein a plurality of motion codes included in one of the plurality of motion-code groups which is associated with one of the plurality of unit-work codes and a plurality of motion codes included in one of the plurality of motion-code groups which is associated with another one of the plurality of unit-work codes are common motion group codes which differ only in motion parameters for the series of plurality of motions which are indicated by the plurality of motion codes and which are to be performed by the at least one of the plurality of work-element performing apparatuses.

There exist a large number of manufacture works in which repeatedly performed works are included. More specifically, in a manufacture work wherein a substrate tray on which a plurality of circuit substrates are placed is conveyed into the manufacture work machine and components are mounted on each of the plurality of circuit substrates, a series of a plurality of works performed on each circuit substrate are substantially the same except for the position at which the mounting work is performed. In such a manufacture work, the repeatedly performed works are made as the unit work, whereby a series of a plurality of motions that constitute the unit work can be made common except for the motion parameter such as the position of the mounting work. In this form, the repeatedly performed works are made as the unit work, and the series of the plurality of motions of the unit work are made common except for the motion parameter. According to this form, therefore, a plurality of motion-code groups which are substantially similar can be made into one motion-code group, thereby rendering the source data simple.

The "motion parameter" described in this form is a parameter to be used when one work-element performing apparatus performs one motion and is the so-called argument. More specifically, the motion parameter includes a direction, an amount, a time, and a velocity of conveyance and movement, an amount, a time, and a velocity of emission of an auxiliary agent, an amount, a time, and a velocity of implementation of treatment and processing, etc. In the above-described work performed on the circuit substrates, for instance, the position of the mounting work can be changed by changing an amount of the movement of a mounter (mounting device).

(27) The manufacture work machine or the central control device according to any one of the forms (21)-(26), wherein the central control device includes a central performable-motion-information storage section configured to store performable-motion information which is information relating to a motion that can be performed by each of the plurality of work-element performing apparatuses, and wherein the motion-command generating section is configured to generate the plurality of motion commands on the basis of the source data stored in the source-data storage section referring to the performable-motion information stored in the central performable-motion-information storage section.

It is possible to store, in the source-data storage section, the source data into which the performable-motion information is incorporated and to generate the motion command on the basis of the source data into which the performable-motion information is incorporated. However, there is a risk that the source data becomes complicated by incorporation of the performable-motion information into the source data. In this form, the performable-motion information is stored in the central control device, and the motion command is generated on the basis of the performable-motion information stored in the central control device and the source data. Therefore, according to this form, it is not necessary to incorporate the performable-motion information into the source data, thereby rendering the source data simple.

The "performable-motion information" described in this form includes information of a motion itself that the work-element performing apparatus can perform when the work-element performing apparatus performs the work element, more specifically, information that the component tray can be supplied where the work-element performing apparatus is the component supplier, information that the component can be held or separated where the work-element performing apparatus is the mounter. Further, the "performable-motion information" includes performance, dimensions, a fiducial point upon operating, of the work-element performing apparatus, for instance. The fiducial point upon operating is a fiducial point when the work-element performing apparatus is operated, and the motion amount of the work-element performing apparatus, etc., are determined using the fiducial point as an origin.

(28) The manufacture work machine or the central control device according to the form (27), wherein the central control device includes a performable-motion-information-input accepting section configured to accept input of the performable-motion information from an exterior.

It is conventionally required to update software for controlling the central control device when performable-motion information is newly stored in the central control device. This form enables new performable-motion information to be inputted and enables the performable-motion information to be easily modified. Further, where the work-element performing apparatus is configured to be exchangeable, the performable-motion information of the work-element performing apparatus to be attached can be stored in the central control device. Accordingly, this form can make the best use of the advantage that the work-element performing apparatus is exchangeable.

(29) The manufacture work machine or the central control device according to the form (28), wherein each of the plurality of work-element performing apparatuses possesses the performable-motion information thereof in itself, and wherein the central control device is configured such that the performable-motion-information-input accepting section accepts the performable-motion information from each of the plurality of work-element performing apparatuses and such that the accepted performable-motion information from each of the plurality of work-element performing apparatuses is stored in the central performable-motion-information storage section.

While the performable-motion information of the respective work-element performing apparatuses may be inputted into the central control device independently of each other, it is troublesome to input the performable-motion information. In particular where the work-element performing apparatus is configured to be exchangeable, it is troublesome to input the performable-motion information every time when the work-element performing apparatus is exchanged. According to this form, it is possible to save the trouble to input the performable-motion information into the central control device, thereby improving convenience of the manufacture work machine or the central control device.

(30) The manufacture work machine or the central control device according to any one of the forms (21)-(29), wherein the motion-command generating section is configured to generate the motion commands each including: (a) a main command for commanding one of initiation and termination of one motion, performed by one of the plurality of work-element performing apparatuses; and (b) an associated command which is associated to the main command as needed for transmitting a motion parameter as to the one motion.

As mentioned above, the "motion parameter" described in this form is a parameter to be used when the work-element performing apparatus performs the one motion and includes an amount, a time, a direction, of the one motion performed by the work-element performing apparatus. In this form, by the one motion command, it is possible to command not only initiation and termination of the one motion of the work-element performing apparatus, but also the amount, the time, the direction, etc., of the one motion. Accordingly, this form enables the work-element performing apparatus to perform a certain degree of complicated work by one motion command.

(31) The manufacture work machine or the central control device according to any one of the forms (21)-(30), wherein the motion-command generating section, is configured to generate the plurality of motion commands on the basis of the source data stored in the source-data storage section, by execution of a generation program, and wherein a programming language of the generation program is different from a programming language of a transmission program for processing relating to transmission of the motion command by the central control device.

(32) The manufacture work machine or the central control device according to the form (31); wherein the programming language of the transmission program is a higher-level programming language than the programming language of the generation program.

The transmission program is a program for processing relating to transmission of the motion command. Where one of the plurality of work-element performing apparatuses is replaced with another work-element performing apparatus, there may arise a need to change the transmission program so as to correspond to another work-element performing apparatus. On the other hand, the generation program is a program for generating, on the basis of the source data, a motion command in accordance with a specific programming language and not for generating a motion command in accordance with the programming language that corresponds to the work-element performing apparatus. Therefore, it is not necessary to change the generation program upon replacement of the work-element performing apparatus. In the latter form, the programming language of the transmission program is easier to understand than the programming language of the generation program, whereby the programming language of the transmission program can be easily changed. According to the latter form, therefore, even where there may arise a need to change the transmission program due to the replacement of the work-element performing apparatus, the transmission program can be easily changed.

The "transmission program" described in each of the above two forms need not be limited to a program for executing the transmission processing of the motion command, but may be a program for executing processing required to transmit the motion command. More specifically, since transmission of the motion command is based on the precondition that the operating states of the plurality of work-element performing apparatuses are normal, the transmission program may be a program for monitoring the operating state of each work-element performing apparatus.

(33) The manufacture work machine or the central control device according to the form (31) or (32), wherein the programming language of the generation program is a structured-type programming language.

(34) The manufacture work machine or the central control device according to any one of the forms (31)-(33), wherein the programming language of the transmission program is a graphic-type programming language.

(35) The manufacture work machine or the central control device according to any one of the forms (31)-(34), wherein the programming language of the transmission program is a ladder language.

In the above three forms, the programming language of the generation program or the transmission program is concretely limited. The graphic-type programming language is also referred to as a visual programming language and represents the program using not text but graphical symbols and the like. Hence, the graphic-type programming language is easier to understand than, the structured-type programming language which represents the program using text and can be changed to a certain degree even by a person who is not familiar with the programming language. Accordingly, by employing the graphic-type programming language as the programming language of the transmission program, it is possible to easily change the transmission program. In this respect, the graphic-type programming language includes various languages such as a ladder language, a function•block•diagram, and a sequential•function•chart. The structured-type programming language includes various languages such as a C language, FORTRAN, and BASIC.

(41) The manufacture work machine or the central control device according to any one of the forms (1)-(31), wherein each of the plurality of work-element performing apparatuses has an individual control device configured to control an operation of said each of the plurality of work-element performing apparatuses.

(42) The manufacture work machine or the central control device according to the form (41),
wherein each of the plurality of work-element performing apparatuses includes at least one operating device for performing a work element corresponding to said each of the plurality of work-element performing apparatuses, and
wherein each of the plurality of work-element performing apparatuses is configured such that the individual control device of said each of the plurality of work-element performing apparatuses controls the at least one operating device.

In the above two forms, each of the plurality of work-element performing apparatuses has an individual control device configured to control the operation of the corresponding work-element performing apparatus, and the individual control device can control the operation of the corresponding work-element performing apparatus on the basis of the motion command transmitted from the central control device. In the above two forms, therefore, it is possible to use the central control device and the work-element performing apparatus as the general-purpose apparatus and the special-purpose device, respectively, so as to replace the work-element performing apparatus depending upon purposes. Accordingly, the above two forms enables a reduction in a cost and a time required for development and production of various manufacture work machines. Further, since the central control device does not need to control the operation of each work-element performing apparatus, the central control device at least needs to have a functional section to merely transmit the motion command to the work-element performing apparatus. Therefore, the above two forms provides the central control device in which the necessity to execute complicated processing is low.

The "operating device" described in this form may be one controllable operating main element in one work-element performing apparatus or a drive source for the operating main element, such as a motor, for instance. Where the work-element performing apparatus is a conveying apparatus, for instance, a conveying device such as a conveyor is one operating device. Where a moving apparatus of an XYZ robot type is the work-element performing apparatus, each of electromagnetic motors which respectively bear movements in respective X, Y, and Z directions is the operating device. It is noted that the operating device is not limited to an operating device functioning as the actuator. Where the plasma treatment apparatus, the laser treatment apparatus or the like is the work-element performing apparatus, for instance, a plasma generator, a laser generator or the like may be the operating device. Where the image taking apparatus is the work-element performing apparatus, an illuminator ox the like is the operating device, in addition to the image taking device such as a camera. Where the work-element performing apparatus includes a plurality of operating devices, the plurality of operating devices are controlled by one individual control device, so that the work-element performing apparatus is formed as an intelligent apparatus.

(43) The manufacture work machine or the central control device according to the form (42), wherein the individual control device is configured to recognize a matter of the motion command transmitted from the central control device and is configured to control an operation of each of the at least one operating device so as to permit one of the plurality of work-element performing apparatuses to which the individual control device belongs to perform one motion corresponding to the motion command.

The number of currently used programming languages is considerably large, and the programming languages used in the respective work-element performing apparatuses often differ from each other. Accordingly, the programming language that defines a plurality of motion commands transmitted by the central control device usually varies among the work-element performing apparatuses to which the motion commands are transmitted. In this form, the individual control device of each work-element performing apparatus recognizes the matter (details) of the motion command transmitted from the central control device, and the operation of the operating device is controlled on the basis of the recognized motion command. According to this form, therefore, it is not necessary to change the programming language that defines the motion command depending upon the work-element performing apparatuses to which the motion commands are transmitted, thereby reducing the central control device in which the necessity to execute complicated processing is further low.

(44) The manufacture work machine or the central control device according to any one of the forms (41)-(43), wherein the central control device is configured to transmit a motion command in a specific programming language, and wherein the individual control device of at least one of the plurality of work-element performing apparatuses includes a command converting section configured to convert the motion command transmitted from the central control device into a motion command in a programming language by which the individual control device can recognize a matter of the motion command.

This form is for concretely realizing the central control device is which there is no need to change the programming language that defines the motion command, depending upon the work-element performing apparatuses to which the motion commands are transmitted. In this form, the motion command transmitted by the central control device is transmitted in the specific programming language irrespective of to which work-element performing apparatus the motion command is transmitted, and the transmitted motion command is converted, in the individual control device of the work-element performing apparatus, into the motion command in the programming language corresponding to the individual control device. According to this form, therefore, the central control device need not change the programming language that defines the motion command, depending upon the work-element performing apparatuses to which the motion commands are transmitted. It is noted that the "the motion command in the programming language" described in this form and the following forms is the motion command according to the programming language and means the motion command defined by a certain programming language, more plainly, the motion command described in a certain programming language.

As mentioned above, the programming languages used in the respective work-element performing apparatuses often differ from each other. Accordingly, where one work-element performing apparatus is replaced with another work-element performing apparatus, it is usually necessary to change programs, etc., of the central control device so as to permit the central control device to transmit the motion command in the programming language used in another work-element performing apparatus, and therefore the replacement of the work-element performing apparatus involves a great deal of labor. In this form, the work-element performing apparatus is configured to convert the motion command into the motion command in accordance with the programming language corresponding thereto, so that the replacement of the work-element performing apparatus does not cause a need to change the programs, etc., of the central control device. Hence, this form enables labor involved in the replacement of the work-element performing apparatus.

(45) The manufacture work machine or the central control device according to any one of the forms (41)-(44), wherein the individual control device is configured to transmit, to the central control device, a reply as to termination of one motion that is being performed by one of the plurality of work-element performing apparatuses that is controlled by the individual control device on the basis of one motion command.

(46) The manufacture work machine or the central control device according to the form (45), wherein the individual control device is configured to transmit, to the central control device, the reply as to termination of the one motion at a termination time point when the one motion is actually terminated.

(47) The manufacture work machine or the central control device according to the form (45), wherein the individual control device is configured to transmit, to the central control device, the reply as to termination of the one motion prior to the termination time point, where the termination time point is estimated.

(48) The manufacture work machine or the central control device according to any one of the forms (45)-(47), wherein the central control device is configured to transmit a next motion command that is to be transmitted subsequent to the one motion command, after having received the reply as to termination of the one motion.

In the above four forms, the central control device can grasp termination of the motion of the work-element performing apparatus which is based on One motion command. The motions of the plurality of work-element performing apparatuses are often correlated. There is an instance in which unless a certain one motion is terminated, the next motion to be subsequently performed cannot be performed. More specifically, when a certain component held by the mounter is mounted on the substrate, for instance, the mounter cannot mount the certain component on the substrate unless the mounter is located at a position of the substrate at which the certain component is mountable. That is, the mounter is allowed to separate the specific component only after the mounter is moved to a certain position. In the last one of the above four forms, after the certain one motion is terminated, the next motion to be subsequently performed can be performed, ensuring a smooth manufacture work.

(49) The manufacture work machine or the central control device according to any one of the forms (45)-(48), wherein the individual control device includes an individual interface section for receiving the motion command transmitted from the central control device according to one protocol, and wherein the individual interface section is configured to transmit the reply as to termination of the one motion according to the one protocol.

(50) The manufacture work machine or the central control device according to the form (49), wherein the central control device includes a central interface section for transmitting the motion command according to the one protocol to the individual control device of each of the plurality of work-element performing apparatuses, and wherein the central interface section is configured to receive the reply as to termination of the one motion according to the one protocol.

In the above two forms, an interface between the individual control device of each of the plurality of work-element performing apparatuses and the central control device is unified with respect to the reply as to termination of the motion corresponding to the motion command. Accordingly, this form reduces labor involved in the replacement of the work-element performing apparatus.

(51) The manufacture work machine or the central control device according to any one of the forms (41)-(50), wherein the central control device includes a motion-command-transmission suspending section configured to suspend transmission of the motion command to the individual control device of one of the plurality of work-element performing apparatuses where the one of the plurality of work-element performing apparatuses does not operate normally.

The "motion-command-transmission suspending section" described in this form may be configured such that, where the one of the plurality of work-element performing apparatuses does not operate normally, the motion command is not transmitted only to the one work-element performing apparatus which does not operate normally or the motion command is not transmitted to the one work-element performing apparatus and the other work-element performing apparatuses. Further, the motion-command-transmission suspending section may be configured not only to suspend transmission of the motion command, but also to notify an operator of the manufacture work machine of abnormality of the work-element performing apparatus by means of an indicator lamp, a buzzer, or the like.

(52) The manufacture work machine or the central control device according to any one of the forms (41)-(51), wherein at least one of the plurality of work-element perforating apparatuses is constructed such that the individual control device is incorporated into a main body configured to actually perform the work element corresponding to each of the at least one of the plurality of work-element performing apparatuses, so as to constitute a unit.

Where the work-element performing apparatus is configured to constitute a unit, it is easy to replace the work-element performing apparatus. In this form, the work-element performing apparatus that constitutes a unit may be the work-element performing apparatus in which the main body and the individual control device are combined. More specifically, the individual control device may be incorporated into a casing or the like of the main body or the individual control device may be fixed to an outside of a member functioning as the casing of the main body or a member functioning as the base body.

(61) A manufacture work system comprising a plurality of manufacture work machines according to any one of the forms (1)-(53), wherein the plurality of manufacture work machines are arranged such that the manufacture works by the plurality of manufacture work machines are sequentially performed.

According to this form, even where a manufacture work includes a plurality of steps, the system can accomplish the manufacture work by permitting one manufacture work machine to bear one step. For downsizing the system, the plurality of manufacture work machines are preferably disposed so as to be adjacent to each other. For smooth conveyance of the work object from the manufacture work machine that performs an earlier step and smooth conveyance of the work object into the manufacture work machine that performs a later step, the conveyors of the respective manufacture work machines are preferably controlled in a cooperative manner. Moreover, where the work-element performing apparatuses are used commonly in the plurality of manufacture work machines by making the bases of the respective manufacture work machines identical to each other or by unifying specifications of the bases of the respective manufacture work machines, it is possible to enhance versatility of the system per se.

(71) A centralized control method of controlling, in a centralized manner, a plurality of work-element performing apparatuses each of which performs one of a plurality of work elements that constitute a manufacture work performed by a manufacture work machine, such that a computer sequentially transmits a plurality of motion commands each of which is a command for one motion to be performed by each of the plurality of work-element performing apparatuses.

(72) The centralized control method according to the form (71), comprising:
a motion-command generating step of generating the plurality of motion commands by the computer on the basis of source data in which is encoded a matter of each of the plurality of work elements to be performed by each of the plurality of work-element performing apparatuses to perform the manufacture work; and
a command-transmission processing step of executing, by the computer, transmission processing to transmit the plurality of motion commands generated in the motion-command generating step to the plurality of work-element performing apparatuses.

(73) The centralized control method according to the form (71) or (72), wherein, in the motion-command generating step, the plurality of motion commands are generated, by the computer, on the basis of the source data referring to performable-motion information which is information relating to a motion that can be performed by each of the plurality of work-element performing apparatuses.

(74) The centralized control method according to the form (73),
wherein each of the plurality of work-element performing apparatuses possesses the performable-motion information thereof in itself,
wherein the centralized control method further comprises a performable-motion-information obtaining step of obtaining, by the computer, the performable-motion information possessed by each of the plurality of work-element performing apparatuses, and
wherein, in the motion-command generating step, the plurality of motion commands are generated by the computer on the basis of the source data referring to the performable-motion information obtained in the performable-motion-information obtaining step.

(75) The centralized control method according to any one of the forms (71)-(74), wherein, in the motion-command generating step, motion commands are generated by the computer, each of the motion commands including (a) a main command for commanding one of initiation and termination of one motion performed by one of the plurality of work-element performing apparatuses; and (b) an associated command which is associated to the main command as needed for transmitting a motion parameter as to the one motion.

(81) An independent control method of independently controlling, by a computer, one of a plurality of work-element performing apparatuses each of which performs one of a plurality of work elements that constitute a manufacture work performed by a manufacture work machine, the manufacture work machine being configured such that a plurality of motion commands each of which is a command for one motion to be performed by each of the plurality of work-element performing apparatuses are sequentially transmitted to the plurality of work-element performing apparatuses, the one of the plurality of work-element performing apparatuses being independently controlled on the basis of the plurality of motion commands.

(82) The independent control method according to the form (81), wherein the manufacture work machine is configured such that the plurality of motion commands in a specific programming language are transmitted to the plurality of work-element performing apparatuses, and wherein the independent control method includes a command converting step of converting, by the computer, a motion command transmitted to the one of the plurality of work-element performing apparatuses into a motion command in a programming language by which the one of the plurality of work-element performing apparatuses can recognize a matter of the motion command.

The above six forms are forms of the claimable invention in which the category of the invention is a control method. Since a detailed explanation of the above six forms overlaps the explanation described above with respect to the manufacture work machine and the central control device, the detailed explanation is omitted. It is possible to apply the technical features of the above-described forms relating to the manufacture work machine and the central control device to the control method of each of the above six forms.

BRIEF DESCRIPTION OF DRAWINGS

FIG. 3 is a view showing a substrate tray conveyed into the manufacture work machine of FIG. 1 and circuit substrates placed on the substrate tray.

FIG. 4 shows a table indicating basic codes of source data stored in the central control device of FIG. 2.

FIG. 5 shows tables indicating unit-work codes of the source data stored in the central control device of FIG. 2.

FIG. 6 shows tables indicating motion codes of the source data stored in the central control device of FIG. 2.

FIG. 7 shows a table indicating motion commands generated on the basis of the source data.

FIG. 8 is a view showing a reply to a motion command.

DESCRIPTION OF EMBODIMENTS

There will be hereinafter explained in detail embodiments of the claimable invention with reference to the drawings. It is to be understood that the claimable invention may be embodied with various changes and modifications based on the knowledge of those skilled in the art, in addition to the following embodiments and various forms described in the FORMS OF INVENTION.

Embodiments

<Structure of Manufacture Work Machine>

Figure 1:
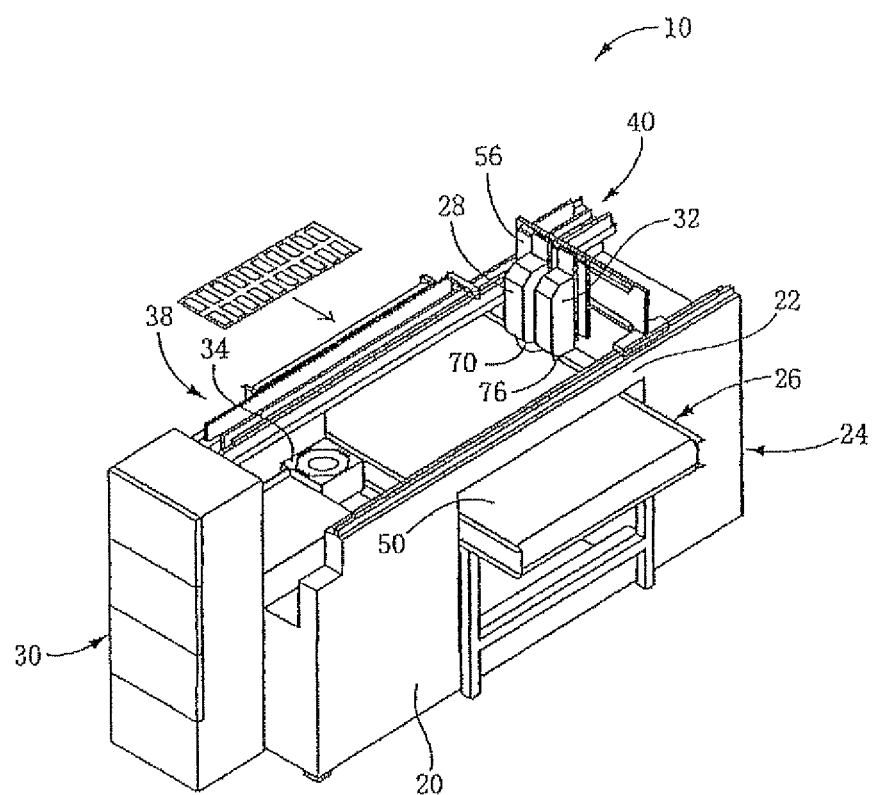
FIG. 1 is a perspective view showing a manufacture work machine according to one embodiment of the claimable invention.

FIG. 1 shows a manufacture work machine 10 according to the claimable invention. The manufacture work machine 10 is configured to carry out mounting of an electronic circuit component or part (hereinafter abbreviated as "component" where appropriate) with respect to a circuit substrate as a base member and application of an adhesive. The manufacture work machine 10 includes: a main body 24, as a base, including a frame portion 20 and a beam portion 22 disposed over the frame portion 20; a conveyor 26 configured to convey the circuit substrate; a mounter 28, as a work head, configured to mount the component on the circuit substrate; a component supplier (hereinafter abbreviated as "supplier" where appropriate) 30 disposed at one end of the frame portion 20 and configured to supply the component to the mounter 28; a dispenser 32 configured to apply an adhesive to the circuit substrate; a camera device 38 including a base camera 34 disposed between the supplier 30 and the conveyor 26 and a head camera 36 (FIG. 10) disposed rearward of the mounter 28; and a moving device 40 disposed in the beam portion 22 and configured to move the mounter 28, the dispenser 32, and the head camera 36 in a region. Here, a longitudinal direction of the manufacture work machine 10 is referred to as a front-rear direction, a horizontal direction perpendicular to the longitudinal direction is referred to as a left-right direction, and a vertical direction perpendicular to the longitudinal direction is referred to as an up-down direction. Since each of the apparatuses 26, 28, 30, 32, 38, 40 that constitute the manufacture work machine 10 is known, an explanation thereof will be made simply.

Figure 2:
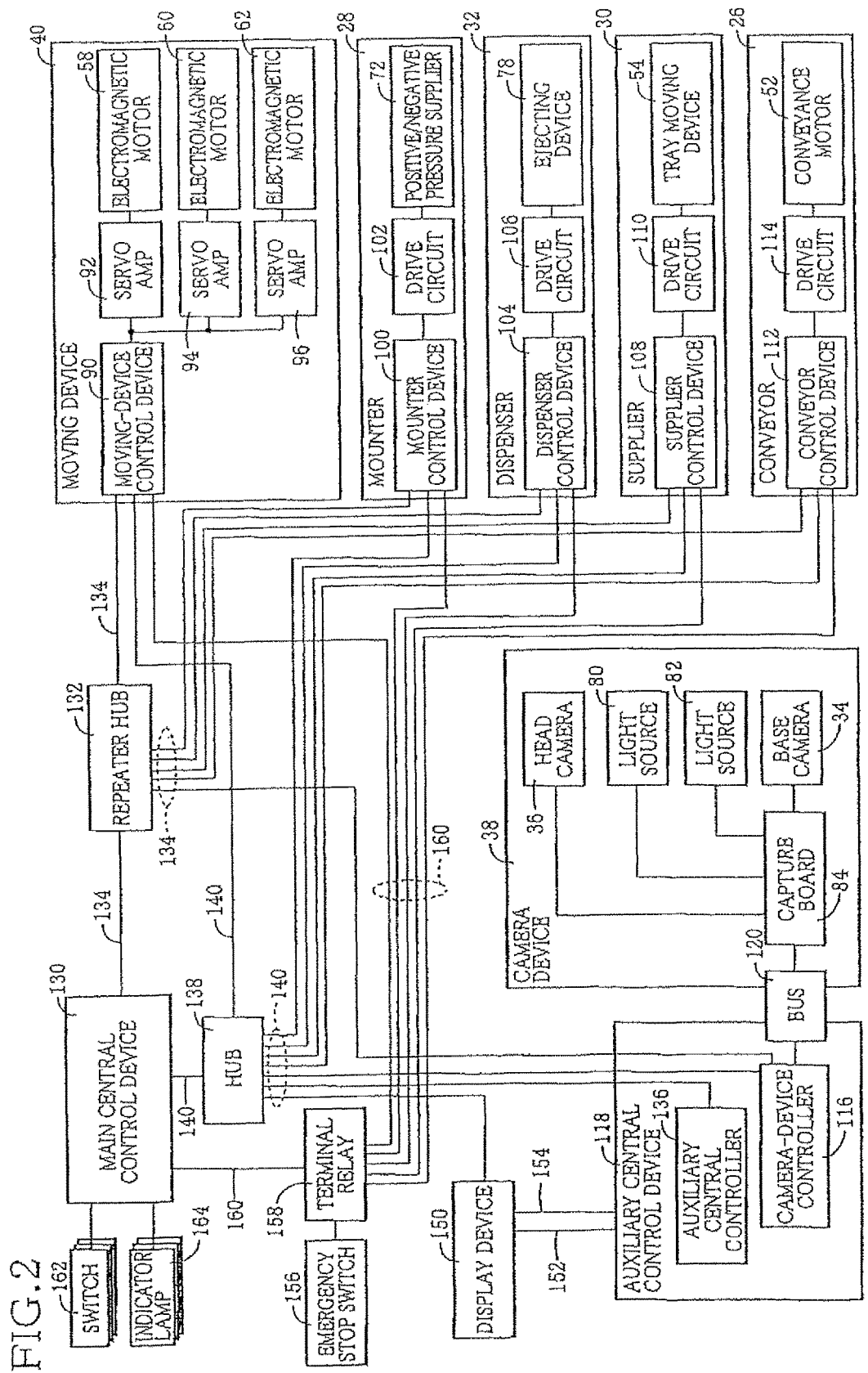
FIG. 2 is a schematic view of a central control device and a plurality of work-element performing apparatuses of the manufacture work machine of FIG. 1.

The conveyor 26 is configured to convey the circuit substrate placed on a conveyor belt 50 in the left-right direction by rotating the conveyor belt 50 by a conveyance motor 52 (FIG. 2). That is, the conveyor 26 function's as a work-element performing apparatus configured to perform conveyance and send-out of the circuit substrate to and from a specific position, as a work element. The supplier 30 is a tray unit type supplier and includes: a plurality of component trays (not shown) on each of which a plurality of components are placed; and a tray moving device 54 (FIG. 2) configured to move any of the plurality of component trays to a position at which the component can be supplied to the mounter 28. That is, the supplier 30 functions as a work-element performing apparatus configured to perform supplying of the components, as a work element.

The moving device 40 is an XYZ-robot-type moving device and includes: an electromagnetic motor 58 (FIG. 2) for permitting a slider 56 that holds the mounter 28, the dispenser 32, and the head camera 36 to slidingly move in the left-right direction: an electromagnetic motor 60 (FIG. 2) for permitting the slider 56 to slidingly move in the front-rear direction; and an electromagnetic motor 62 (FIG. 2) for permitting the slider 56 to slidingly move in the up-down direction. The operations of the electromagnetic motors 58, 60, 62 enable the mounter 28, the dispenser 32, and the head camera 36 to respective arbitrary positions. That is, the moving device 40 functions as a work-element performing apparatus configured to perform a movement of the mounter 28, the dispenser 32, and the head camera 36.

The mounter 28 is fixedly held by the slider 56 of the moving device 40 and includes, at its lower end, a component holder 70. The component holder 70 communicates with a negative-pressure air passage and a positive-pressure air passage via a positive/negative pressure supplier 72 (FIG. 2) and is configured to suction-hold the component by a negative pressure and to separate the suction-held component by a slight positive pressure supplied thereto. That is, the mounter 28 functions as a work-element performing apparatus configured to perform holding and separation of the component, as a work element. The dispenser 32 is fixedly held by the slider 56 of the moving device 40 and includes: a dispenser nozzle 76 provided at a lower end of the dispenser 32 for ejecting an adhesive; and an ejecting device 78 (FIG. 2) for permitting ejection of an arbitrary amount of the adhesive from the dispenser nozzle 76. That is, the dispenser 32 functions as a work-element performing apparatus configured to perform ejection of the adhesive, as a work element.

The camera device 38 is constituted by: a head camera 36 fixedly disposed at a lower portion of the slider 56 so as to face downward; a light source 80 (FIG. 2) for the head camera 36; a base camera 34 fixedly disposed between the supplier 36 and the conveyor 26 so as to face upward; a light source 82 (FIG. 2) for the base camera 34; and a capture board 84 (FIG. 2) connected to the head camera 36, the base camera 34, and the light sources 80, 82. The head camera 36 is capable of taking an image of the circuit substrate on the conveyor 26 while the base camera 34 is capable of taking an image of the component which is suction-held by the mounter 28. That is, the camera device 38 functions as a work-element performing apparatus configured to perform image taking of the circuit substrate and the component, as a work element.

Since the moving device 40 is for moving the mounter 28, the dispenser 32, and the head camera 36, the moving device 40 may be considered as a work-element performing apparatus configured to perform a movement of other work-element performing apparatus. Further, since the moving device 40 changes a holding position and a separation position of the component in association with the movement of the mounter 28, the moving device 40 may be considered as a work-element performing apparatus configured to perform a movement and a change of the holding position and the separation position of the component. Moreover, since the moving device 40 changes an ejection position of the adhesive and an image taking position of the circuit substrate in association with movement of the dispenser 32 and the movement of the head camera 36, the moving device 40 may be considered as a work-element performing apparatus configured to perform a movement and a change of the ejection position of the adhesive and the image taking position of the circuit substrate.

The present manufacture work machine 10 is constituted by six work-element performing apparatuses, namely, the conveyor 26, the mounter 28, the supplier 30, the dispenser 32, the camera device 38, and the moving device 40. The six work-element performing apparatuses individually include respective control devices, as shown in FIG. 2. More specifically, the moving device 40 includes: a moving-device control device 90, as the individual control device, for controlling the operations of the respective three electromagnetic motors 58, 60, 62 each as an operating device; and three servo amps 92, 94, 96 that correspond to the respective three electromagnetic motors 58, 60, 62. The moving-device control device 90 is configured to send control signals to each servo amp 92, 94, 96, thereby controlling the operations of the respective electromagnetic motors 58, 60, 62. The mounter 28 includes: a mounter control device 100, as the individual control device, for controlling the operation of the positive/negative pressure supplier 72 as an operating device; and a drive circuit 102 for the positive/negative pressure supplier 72. The mounter control device 100 is configured to send a control signal to the drive circuit 102, thereby controlling the operation of the positive/negative pressure supplier 72.

The dispenser 32 includes: a dispenser control device 104, as the individual control device, for controlling the operation of the ejecting device 78 as an operating device; and a drive circuit 106 for the ejecting device 78. The dispenser control device 104 is configured to send a control signal to the drive circuit 106, thereby controlling the operation of the ejecting device 78. The supplier 30 includes: a supplier control device 108, as the individual control device, for controlling the operation of the tray moving device 54 as an operating device; and a drive circuit 110 for a motor as a drive source of the tray moving device 54. The supplier control device 108 is configured to send a control signal to the drive circuit 110, thereby controlling the operation of the tray moving device 54. The conveyor 26 includes: a conveyor control device 112, as the individual control device, for controlling the operation of the conveyance motor 52 as an operating device; and a drive circuit 114 for the conveyance motor 52. The conveyor control device 112 is configured to send a control signal to the drive circuit 114, thereby controlling the operation of the conveyance motor 52.

The camera device 38 includes, as the individual control device, a camera-device controller 116 for executing transmission of a control signal to perform image taking by the base camera 34 or the head camera 36 and for executing processing of image data obtained by the image taking. While the camera-device controller 116 is provided in an auxiliary central control device 118 which will be explained, the camera-device controller 116 is independent in the auxiliary central control device 118 and is connected to the capture board 84 of the camera device 38 via a bus 120. Therefore, the camera-device controller 116 is not treated as a constituent element of the auxiliary central control device 118, but is treated as a constituent element of the camera device 38.

The manufacture work machine 10 further includes a central control device constituted by: a main central control device 130 configured to control the six work-element performing apparatuses 26, 28, 30, 32, 38, 40 in a centralized manner; and the auxiliary central control device 118. The main central control device 130 is mainly for transmitting a motion command to the individual control device 90, 100, 104, 108, 112, 116 of each of the apparatuses 26, 28, 30, 32, 38, 40. The main central control device 130 is connected, via a repeater hub 132, to the respective individual control devices 90, 100, 104, 108, 112, 116 by respective serial communication cables 134 of the same kind for transmission of the motion commands. The auxiliary central control device 118 includes an auxiliary central controller 136. In the auxiliary central controller 136, there is stored a source program which is a basis of the motion commands to the individual control device 90, etc., namely, source data for performing a specific manufacture work. (Hereinafter, "the individual control device 90, etc." collectively refer to each of the individual control devices 90, 100, 104, 108, 112, 116 where appropriate.) In the stored source data, the operation of each of the six work-element performing apparatuses 26, etc., is encoded. The auxiliary central controller 136 is configured to convert the source data into the motion commands in accordance with a certain specific programming language and to transmit the converted motion commands to the main central control device 130. The auxiliary central controller 136 and the main central control device 130 are connected to each other by a LAN cable 140 via a hub 138, and the motion commands converted in the auxiliary central controller 136 are transmitted to the main central control device 130 via the LAN cable 140. To the hub 138, one end of each of six LAN cables 140 which are identical to the LAN cable 140 in kind is connected, and another end of each of the six LAN cables 140 is connected to a corresponding one of the individual control devices 90, etc., of the respective work-element performing apparatuses 26, etc. (Hereinafter, "the work-element performing apparatus 26, etc." collectively refer to each of the work-element performing apparatuses 26, 28, 30, 32, 38, 40 where appropriate.) Each of the serial communication cables 134 and the LAN cables 140 is constituted by a wire portion and connector portions, each of which may be a general-purpose item or a special item developed exclusively for the present manufacture work machine 10.

The manufacture work machine 10 further includes a display device 150 of a touch-panel type through which information as to the operation of the manufacture work machine 10 is inputted and outputted. The display device 150 is connected to: the main central control device 130 by a LAN cable 140 which is identical in kind to the LAN cables 140 via the hub 138; and the auxiliary central controller 136 by a serial communication cable 152 and an RGB analog cable 154. The manufacture work machine 10 further includes an emergency stop switch 156 which is connected to the main central control device 130 and the individual control device 90, etc., of the work-element performing apparatus 26, etc., by I/O cables 160 via a terminal relay 158. To the main central control device 130, there are connected: a plurality of switches 162 such as a power source switch and a startup switch of the manufacture work machine 10; and a plurality of indicator lamps 164 such as an indicator lamp indicating that the manufacture work machine 10 is in startup and an indicator lamp indicating that the manufacture work machine 10 is in an operable state.

<Operation of Manufacture Work Machine>

In the present manufacture work machine 10, the above-described six work-element performing apparatuses 26, etc., perform respective works according to the source data stored in the auxiliary central controller 136, whereby a mounting work with respect to the circuit substrate is performed. There will be concretely explained a manufacture work in which the component is fixed onto the circuit substrate by the adhesive. As shown in FIG. 3(a), twenty circuit substrates 166, each as a first component, are placed in advance on a substrate tray 167, and the substrate tray 167 is conveyed into the present manufacture work machine 10. An adhesive 168 is applied to one of the circuit substrates 166 on the substrate tray 167, as shown in FIG. 3(b). As shown in FIG. 3(c), an electronic circuit component 169, as a second component, is mounted on the adhesive 168 applied as described above. The adhesive application work and the component mounting work are thus performed, whereby the work on one circuit substrate 166 is completed, and the adhesive application work and the component mounting work are subsequently performed on another circuit substrate 166. When the works with respect to all of the twenty circuit substrates 166 are completed, the substrate tray 167 is conveyed out of the manufacture work machine 10.

The source data relating to the manufacture work has three kinds of basic codes given thereto, as shown in FIG. 4. The basic codes include a preparation work for performing a work with respect to the circuit substrate 166, a work with respect to the circuit substrate 166 (i.e., substrate-related work), and a finishing work performed after the work with respect to the circuit substrate 166. Since the work with respect to the circuit substrate 166 (the substrate-related work) needs to be performed on the twenty circuit substrates 166, twenty substrate-related works are included. While, in FIG. 4, names of the basic codes are described, there may be instances in which information as to work performance such as positional information of each circuit substrate 166 is described, together with the names of the basic codes.

Each of the three kinds of basic codes is encoded as shown in FIG. 5 and is constituted by at least one unit-work code. More specifically, the preparation-work code is constituted by a unit-work code for performing preparation of the substrate tray 167 and the component trays on each of which the components to be mounted are placed (tray preparation). The finishing-work code is constituted by a unit-work code for performing sent-out of the substrate tray 167 (tray send-out). The substrate-related-work code is constituted by three kinds of unit-work codes including: obtaining of information relating to the circuit substrate 166 (substrate-information obtaining); application of the adhesive to the circuit substrate 166 (adhesive application); and mounting of the component on the circuit substrate (component mounting). There may be instances in which information as to work performance such as a conveyance amount of the substrate tray 167 is described in any of the unit-work codes.

In each unit-work code, a unit work constituted by a series of a plurality of works is encoded, as shown in FIG. 6 and is constituted by a plurality of motion codes, namely, a motion-code group. It is noted, however, that the tray-send-out code is constituted by only one motion code. More specifically, the tray-preparation code is constituted by a motion code for conveying the substrate tray 167 to a specific position and a motion code for supplying the component tray on which are placed the components to be mounted. The substrate-information-obtaining code is constituted by a motion Code for moving the head camera 36 to a position at which the head camera 36 can take an image of the circuit substrate 166 and a motion code for taking an image of the circuit substrate 166 by the head camera 36 and obtaining the positional information of the circuit substrate 166. The adhesive application code is constituted by a motion code for moving the dispenser 32 to an application position of the adhesive on the basis of the obtained positional information and a motion code for applying the adhesive to the circuit substrate 166. The component-mounting code is constituted by a motion code for moving the mounter 28 to a supply position of the component, a motion code for holding the component, a motion code for moving the mounter 28 that holds the component above the base camera 34, a motion code for taking, by the base camera 34, an image of the component held by the mounter 28 and obtaining information on the hold state of the component, a motion code for moving the mounter 28 to a mounting position of the component on the basis of the positional information of the circuit substrate and the information on the hold state of the component, and a motion code for separating the component. The tray-send-out code is constituted by a motion code for sending out the circuit substrate 166 on which the component has been mounted; namely, the substrate tray 167 on which assembled articles are placed.

The source data encoded so as to have the hierarchy structure described above is stored in the auxiliary central controller 136, and performable-motion information as to the motion that can be performed by each of the six work-element performing apparatuses 26, etc., is also stored in the auxiliary central controller 136. The performable-motion information includes the motion that can be performed by each work-element performing apparatus when the apparatus performs the work. For instance, the performable-motion information includes the movement of the mounter 28, etc., where the work-element performing apparatus is the moving device 40 and includes the holding or the separation of the component where the work-element performing apparatus is the mounter 28. The performable-motion information further includes an operating range and dimensions of the work-element performing apparatus, a fiducial point upon operating, and so on. Here, the fiducial point upon operating is a fiducial point when the work-element performing apparatus operates, and the motion amount of the work-element performing apparatus, etc., are determined using the fiducial point as an origin.

In the present manufacture work machine 10, motion commands are generated in the auxiliary central controller 136 on the basis of the source data. Each motion command is a command which relates to the motion that can be performed by each of the six work-element performing apparatuses 26, etc., and which is transmitted to each of the six work-element performing apparatuses 26, etc. When the motion commands are generated, the above-described performable-motion information is referred to, and the motion commands including the operating manner, the motion amount, etc., of each of the work-element performing apparatuses 26, etc., are generated. More specifically, as shown in FIG. 7, the following motion commands are generated: (1) a motion command for conveying the circuit substrate by the conveyor 26 by a specific amount; (2) a motion command for supplying a specific component tray by the supplier 30; (3) a motion command for moving the head camera 36 by the moving device 40 by a specific amount; (4) a motion command for obtaining the positional information of the circuit substrate by image taking by the head camera 36; (5) a motion command for moving the dispenser 32 by the moving device 40 by a specific amount; (6) a motion command for ejecting the adhesive by the dispenser 32 by a specific amount; (7) a motion command for moving the mounter 28 by the moving device 40 by a specific amount; (8) a motion command for holding the component by the mounter 28; (9) a motion command for moving the mounter 28 by the moving device 40 by a specific amount; (10) a motion command for obtaining information as to the hold state of the component by image taking by the base camera 34; (11) a motion command for moving the mounter 28 by the moving device 40 by a specific amount; (12) a motion command for separating the component by the mounter 28; and (203) a motion command for conveying the circuit substrate by the conveyor 26 by a specific amount. Here, the motion commands Nos. (3)-(202) are for performing the work with respect to one circuit substrate 166. In the motion commands No. (13)-(202), the motion commands substantially similar to the motion commands Nos. (3)-(12) are repeated nineteen times. It is noted, however, that the moving amounts of the moving device 40 in the respective motion commands Nos. (13)-(202) differ from each other for the respective circuit substrates 166.

As explained above, a group of two hundred and three motion commands shown in FIG. 7 are generated in the auxiliary central controller 136 on the basis of the source data in the format shown in FIGS. 4-6. In the present manufacture work machine 10, the source data is encoded according to a structured programming technique, namely, according to a technique of describing, in stepwise, the work for performing the manufacture work into detailed units. The source data described in the three-level hierarchy structure is comparatively simple, as compared with the motion command group shown in FIG. 7. More specifically, in each of the substrate-information-obtaining code, the adhesive application code, and the component-mounting code among the unit-work codes shown in FIG. 6, the motion codes are made common to all of the twenty circuit substrates 166, and it is considered that each of the three unit-work codes is constituted by common motion group codes. Since the motion group in each unit-work code is made common to all of the circuit substrates, it is required to only describe, in the source data, the substrate-information-obtaining code, the adhesive application code, and the component-mounting code for one circuit substrate 166, thereby eliminating a need to describe, repeatedly twenty times, the motion codes that constitute each of the three unit-work codes. Accordingly, in the present manufacture work machine 10, the source data can be easily formed. In this respect, even, if the motion codes are the common motion group codes, the positions at which the respective circuit substrates 166 are placed differ from each other, and motion parameters of the moving device 40, etc., namely, the moving amounts of the moving device 40, etc., differ from each other. Accordingly, the motion parameters are adjusted for each circuit substrate when the motion commands are generated.

The above-described plurality of motion commands are transmitted from the auxiliary central controller 136 to the main central control device 130 via the LAN cable 140, and the plurality of motion commands are sequentially transmitted by the main central control device 130 to the individual control devices 90, etc, of the respective work-element performing apparatuses 26, etc., via the respective serial communication cables 134. The motion commands from the main central control device 130 are transmitted to the individual control devices 90, etc., of all of the work-element performing apparatuses 26, etc., without particularly specifying destination devices. However, as explained below, each motion command designates the work-element performing apparatus to be operated by the motion command. Therefore, the work-element performing apparatus to be operated is configured to be operated in accordance with the motion command. Hereinafter, the operations of the work-element performing apparatuses according to the respective motion commands are concretely explained.

The main central control device 130 initially transmits, via the serial communication cable 134, a motion command for conveying the substrate tray 167 to a specific position. The motion command to be transmitted is in a format shown in the motion command No. (1) in FIG. 7. A main command in FIG. 7 is for commanding: the work-element performing apparatus which should perform one motion that corresponds to the motion command: and initiation or termination of the one motion to be performed by the work-element performing apparatus. The main command in this motion command is for commanding initiation of conveyance of the substrate tray 167 by the conveyor 26. An associated command in FIG. 7 is issued as needed and is for commanding the motion parameter for the one motion to be performed by the work-element performing apparatus. More specifically, the associated command in this motion command is for commanding a conveyance amount by the conveyor 26, namely, a moving distance. As the associated command, there may be employed various parameters such as a conveyance speed, a conveyance time, and a conveyance direction. A command state in FIG. 7 indicates presence or absence of the motion command. In a state in which the motion command is being issued, the command state is set to "command issuing". In a state in which the motion command is not issued, the command state is set to "command absent". That is, in this motion command, the command state is set to "command issuing".

The conveyor control device 112 which has received the motion command from the main central control device 130 needs to control the operation of the conveyance motor 52 on the basis of the motion command. However, the motion command transmitted from the main central control device 130 is based on a certain specific programming language and is not based on a programming language that the conveyor control device 112 can handle. Therefore, the motion command transmitted from the main central control device 130 cannot cause the conveyance motor 52 to operate. The conveyor control device 112 has a function of converting the motion command from the main central control device 130 into a motion command based on a programming language compatible thereto, namely, a programming language that the conveyor control device 112 can handle. The conveyor control device 112 is configured to control the operation of the conveyance motor 52 on the basis of the motion command converted by itself. The matters of the main command, the associated command, etc., indicated in FIG. 7, more specifically, "conveyor: conveyance", "conveyance amount", etc., in the motion command No. (1) are the motion commands according to the certain specific programming language.

It is noted that each of the individual control devices 100, 104, 108 of the mounter 28, the supplier 30, and the dispenser 32, respectively, has a similar function and can convert the motion command from the main central control device 130 into a motion command based on a programming language compatible thereto. However, the moving-device control device 90 of the moving device 40 and the camera-device controller 116 of the camera device 38 can handle the programming language that defines the motion command transmitted from the main central control device 130. Therefore, the moving-device control device 90 and the camera-device controller 116 do not have a function of converting the motion command from the main central control device 130 into a motion command in the programming language compatible thereto.

When the operation of the conveyor 26 by the motion command from the main central control device 130 is terminated, namely, when the substrate tray 167 is conveyed to the specific position, a reply to the motion command is transmitted from the conveyor control device 112 to the main central control device 130 via the serial communication cable 134. The reply to be transmitted is in a format shown in FIG. 8. An operation result in FIG. 8 indicates whether or not the operation of the work-element performing apparatus by the motion command has been appropriately performed. In this reply, whether or not the substrate tray 167 has been conveyed to the specific position is indicated. The operation result in FIG. 8 may indicate, as needed, a parameter of the operation result such as the position to which the substrate tray 167 has been conveyed. A command state in FIG. 8 indicates completion of the operation of the work-element performing apparatus by the motion command. In this reply, the command state is set to "completion". When the main central control device 130 receives the reply as to termination, the command state is set to "command absent". Here, a state of the work-element performing apparatus in FIG. 8 indicates whether or not there is abnormality in the work-element performing apparatus. The state of the work-element performing apparatus is not utilized in the reply to the motion command, but is utilized in transmission when there is a risk that the work-element performing apparatus does not operate normally, as explained below.

The main central control device 130 transmits next motion command after it is confirmed that the substrate tray 167 has been conveyed to the specific position, namely, after the command state has been set to "command absent" by reception of the reply as to termination of the conveyance. The next motion command is in a format shown in the motion command No. (2) of FIG. 7 and is for supplying the component tray on which the components to be mounted are placed. In this motion command, the main command is for commanding supply of the component tray by the supplier 30 while the associated command is for designating the component tray on which the components to be mounted are placed. When the supplier control device 108 receives the motion command, the supplier control device 108 converts the motion command from the main central control device 130 into a motion command based on a programming language which the supplier control device 108 can handle, like the conveyor control device 112, and controls the operation of the tray moving device 54 on the basis of the motion command converted by itself. When the operation by the motion command is terminated, a reply to the motion command is transmitted from the supplier control device 108 to the main central control device 130 via the serial communication cable 134. Here, there may be an instance in which the positional information of the component to be mounted is attached to the operation result in the reply from the supplier control device 108.

Next, the main central control device 130 transmits the motion command (the motion command No. (3) in FIG. 7) for moving the head camera 36 to a position at which an image of the circuit substrate 166 on the substrate tray 167 can be taken, after the command state has been set to "command absent" by reception of the reply as to termination of the tray supply. In the present manufacture work machine 10, the reply as to termination of the tray supply is transmitted after supply of the specific component has been terminated. Where a termination time point of the tray supply is estimated, the reply as to termination of the tray supply may be transmitted prior to the termination time point. Even if the mounter 28 is moved by the moving device 40 in the midst of supplying of the component tray, the two works are not likely to mutually interfere. Accordingly, by moving the mounter 28 by the moving device 40 in the midst of supplying of the component tray, it is possible to reduce a time required for the manufacture work.

In the motion command for moving the head camera 36, the main command is for commanding initiation of the movement of the head camera 36 by the moving device 40 while the associated command is for commanding a moving amount in the front-rear direction, a moving amount in the left-right direction, and a moving amount in the up-down direction. In setting the associated command, it is possible to utilize the operation result in the reply from the conveyor control device 112, more specifically, information as to the position to which the substrate tray 167 has been conveyed. When the moving-device control device 90 receives the motion command, the moving-device control device 90 controls the operation of each of the three electromagnetic motors 58, 60, 62 on the basis of the received motion command, without converting the received motion command, because the moving-device control device 90 can recognize the programming language that defines the motion command transmitted from the main central control device 130 as explained above. When the operation of the moving device 40 by the motion command is terminated, the reply to the motion command is transmitted from the moving-device control device 90 to the main central control device 130 via the serial communication cable 134.

Subsequently, the main central control device 130 transmits a next motion command after the command state has been set to "command absent" by reception of the reply as to termination of the movement of the head camera 36. More specifically, the main central control device 130 transmits the motion command (the motion command No. (4) in FIG. 7) for taking an image of the substrate by the head camera 36 and obtaining the positional information of the substrate. In this motion command, the main command is for commanding the image taking of the circuit substrate 166 by the head camera 36 and initiation of processing of the image data obtained by the image taking. Like the moving-device control device 90, the camera-device controller 116 can recognize the programming language that defines the motion command transmitted from the main central control device 130. Accordingly, when the camera-device controller 116 receives the motion command, the camera-device controller 116 controls the head camera 36 and the light source 80 on the basis of the received motion command. The camera-device controller 116 processes the image data obtained by the image taking, thereby obtaining the positional information of the circuit substrate 166. When the operation by the motion command is terminated, a reply to the motion command is transmitted from the camera-device controller 116 to the main central control device 130. There is attached position data of the circuit substrate 166 obtained by the image taking to the operation result in the reply from the camera-device controller 116.

After the command state has been set to "command absent" by reception of the reply as to termination of obtaining of the positional information of the circuit substrate 166, the main central control device 130 transmits the motion command (the motion command No. (5) in FIG. 7) for moving the dispenser 32 to a position at which the adhesive is to be applied. In this motion command, the main command is for commanding initiation of the movement of the dispenser 32 by the moving device 40 while the associated command is for commanding amounts of the movement in the front-rear direction, the left-right direction, and the up-down direction, respectively. In setting the associated command, the operation result in the reply from the camera-device controller 116, more specifically, the positional information of the circuit substrate 166 is utilized. When the moving-device control device 90 receives the motion command, the moving-device control device 90 controls the operations of the respective electromagnetic motors 58, 60, 62 on the basis of the received motion command. When the operation by the motion command is terminated, a reply to the motion command is transmitted from the moving-device control device 90 to the main central control device 130.

After the command state has been set to "command absent" by reception of the reply as to termination of the movement of the dispenser 32, the main central control device 130 transmits the motion command (the motion command No. (6) in FIG. 7) for applying the adhesive to the circuit substrate 166. In this motion command, the main command is for commanding initiation of ejection of the adhesive by the dispenser 32 while the associated command is for commanding an ejection amount of the adhesive. As the associated command, there may be employed various motion parameters such as an ejection speed, an ejection time, an opening amount of an ejection hole through which the adhesive is ejected. Unlike the moving-device control device 90 and the camera-device controller 116, the dispenser control device 104 cannot handle the programming language that defines the motion command transmitted from the main central control device 130. Accordingly, when the dispenser control device 104 receives the motion command, the dispenser control device 104 converts the motion command from the main central control device 130 into a motion command according to a programming language which the dispenser control device 104 can handle and controls the operation of the ejecting device 78 on the basis of the motion command converted by itself. When the adhesive 168 is applied to the specific position on the circuit substrate 166 by the operation by the ejecting device 78 based on the motion command, a reply to the motion command is transmitted from the dispenser control device 104 to the main central control device 130. An explanation of the operation of each of the work-element performing apparatuses 28, etc., by subsequent motion commands is dispensed with for avoiding redundancy of the description.

In each of the individual control devices 90, etc., of the respective work-element performing apparatuses 26 etc., there is incorporated an IC chip (not shown) in which identification information for identification of each device is stored. Upon startup of the manufacture work machine 10, the identification information stored in the IC chip is transmitted to the main central control device 130 via the LAN cables 140. The main central control device 130 is configured to transmit the motion command only where transmission of the identification information from each of the individual control devices 90, etc., is confirmed. In the present manufacture work machine 10, while the identification information is transmitted via the LAN cables 140, the identification information may be transmitted via the serial communication cables 134 or the I/O cables 160. Further, the identification information may be transmitted in wireline communication or wireless communication.

Where there is a risk that the work-element performing apparatus 26 etc., does not operate normally due to abnormality thereof, the corresponding individual control device 90, etc., of the work-element performing apparatus 26, etc., which is suffering from the abnormality transmits information that there is a risk of operation failure, to the main central control device 130 via the serial communication cable 134. More specifically, data in a format shown in FIG. 8 is transmitted from the individual control device 90, etc., of the work-element performing apparatus 26, etc., which may not operate normally, to the main central control device 130. The main central control device 130 which has received the data suspends transmission of the motion commands not only to the individual control device 90, etc., of the work-element performing apparatus 26, etc., which may not operate normally, but also to the individual control devices 90, etc., of all of the work-element performing apparatuses 26, etc., so as to deal with the abnormality of the work-element performing apparatus 26, etc. The main central control device 130 is capable of grasping the abnormality of the work-element performing apparatus 26, etc., by communication through the serial communication cable 134. In view of fail-safe or the like, the individual control device 90, etc., of the work-element performing apparatus 26, etc., which is suffering from the abnormality transmits the information of the abnormality to the main central control device 130 also via the I/O cable 160.

Each of the individual control, devices 90, etc., of the work-element performing apparatuses 26, etc., is configured to individually store performable-motion information which is information relating to the motion that can be performed by the corresponding work-element performing apparatus 26, etc. The performable-motion information to be stored includes not only the motion that the work-element performing apparatus can perform and the operation range and the dimensions of the work-element performing apparatus, but also the capability of the work-element performing apparatus and the control gain of the work-element performing apparatus. The capability of the work-element performing apparatus to be stored includes output capability of an electromagnetic motor where the apparatus includes the electromagnetic motor and a speed reduction ratio of a speed reducer where the apparatus includes the speed reducer. The control gain to be stored includes a control gain in determining a supply power to an electromagnetic motor where the apparatus includes the electromagnetic motor.

The performable-motion information stored in the individual control device 90, etc., of the work-element performing apparatus is transmitted from the individual control device 90, etc., to the auxiliary central controller 136 via the LAN cable 140 and stored in the auxiliary central controller 136. The performable-motion information stored in the auxiliary central controller 136 is not only utilized in generating the motion command on the basis of the source data as described above, but also utilized in backup or the like. Where the control gain of each of the electromagnetic motors 58, 60, 62 of the moving device 40 is stored in the auxiliary central controller 136, for instance, the control gain of each of the electromagnetic motors 58, 60, 62 of the moving device 40 can be changed by changing the stored control gain and transmitting information as to the changed control gain to the moving-device control device 90.

The individual control device 90, etc., of the work-element performing apparatus 26 etc., is incorporated, in a main body of the work-element performing apparatus 26, etc., namely, the main body that actually operates to perform the work element, or is located in the manufacture work machine 10. Accordingly it is rather difficult to directly access the individual control device 90, etc., for program change, program version up and so on of the individual control device 90, etc. In the present manufacture work machine 10, therefore, it is possible to transmit the changed program and so on from the auxiliary central controller 136 to the individual, control device 90, etc, of the work-element performing apparatus 26, etc., via the LAN cable 140.

<Functional Structure of Each Control Device>

Figure 9:
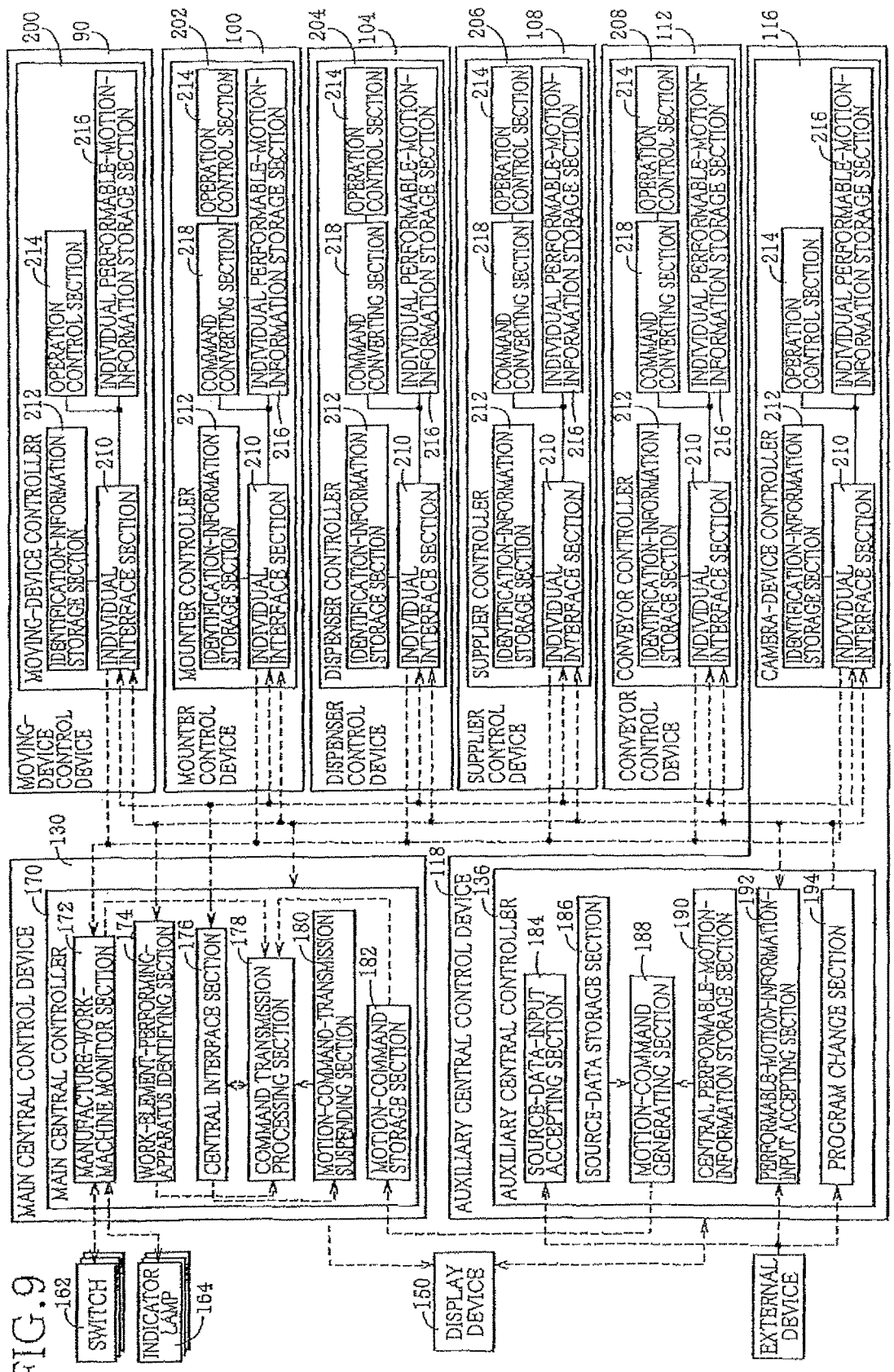
FIG. 9 is a control block diagram of the central control device and the plurality of work-element performing apparatuses of the manufacture work machine of FIG. 1.

The main central control device 130, the auxiliary central control device 118, and the individual control device 90, etc., of the work-element performing apparatus 26 etc., of the manufacture work machine 10 may be regarded to have functional structures shown in FIG. 9 in view of processing to be performed by each of the same 130, 118, 90, etc. As apparent from FIG. 9, the main central, control device 130 has a main central controller 170 constituted principally by a computer equipped with a CPU, a ROM, a RAM and so on. The main central controller 170 includes: a manufacture-work-machine monitor section 172 as a functional section to monitor the operating state of the manufacture work machine 10; a work-element-performing-apparatus identifying section 174 to identify the work-element performing apparatuses 26, etc., to which the motion command can be transmitted, by obtaining the identification information from the individual control devices 90, etc., of the work-element performing apparatuses 26, etc.; a central interface section 176 as a functional section to communicate with the individual control devices 90, etc.; a command transmission processing section 178 as a functional section to execute transmission processing of the motion command; a motion-command-transmission suspending section 180 as a functional section to suspend transmission of the motion command when there is a risk that any of the work-element performing apparatuses 26, etc., does not normally operate; and a motion-command storage section 182 as a functional section to store the plurality of motion commands.

The auxiliary central controller 136 of the auxiliary central control device 118 includes: a source-data-input accepting section 184 as a functional section to accept input of the source data from the exterior; a source-data storage section 186 as a functional section to store the source data; a motion-command generating section 138 as a functional section to generate the motion command on the basis of the source data; a central performable-motion-information storage section 190 as a functional section to store the performable-motion information of all of the work-element performing apparatuses 26, etc., in a centralized manner; a performable-motion-information-input accepting section 192 as a functional section to accept input of the performable-motion information from the exterior; and a program change section 194 as a functional section to change programs of the individual control devices 90, etc., of the work-element performing apparatuses 26, etc.

Each of the moving-device control device 90, the mounter control device 100, the dispenser control device 104, the supplier control device 108, and the conveyor control device 112 includes a controller constituted principally by a computer equipped with a CPU, a ROM, a RAM and so on. More specifically, the moving-device control device 90 includes a moving-device controller 200. The mounter control device 100 includes a mounter controller 202. The dispenser control device 104 includes a dispenser controller 204. The supplier control device 108 includes a supplier controller 206. The conveyor control device 112 includes a conveyor controller 208. Each of the moving-device controller 200, the mounter controller 202, the dispenser controller 204, the supplier controller 206, the conveyor controller 208, and the camera-device controller 116 includes: an individual interface section 210 as a functional section to communicate with the main central controller 170 and the auxiliary central controller 136; an identification-information storage section 212 as a storage section to store the identification information of the work-element performing apparatus 90, etc.; an operation control section 214 as a functional section to control the operation of the work-element performing apparatus 26, etc., on the basis of the motion command; and an individual performable-motion-information storage section 216 as a functional section to individually store the performable-motion information of the work-element performing apparatus 26, etc. Further, each of the mounter controller 202, the dispenser controller 204, the supplier controller 206, and the conveyor controller 208 includes a command converting section 218 as a functional section to convert the motion command from the main central control device 130 into a motion command according to a programming language that the individual control device 90, etc., of itself can handle.

The manufacture-work-machine monitor section 172 of the main central controller 170 is configured to receive transmission of information that the work-element performing apparatus 26, etc., is suffering from abnormality from the individual control device 90, etc., via the I/O cable 160 and to receive ON/OFF information of the plurality of switches 162. On the basis of the received information, the manufacture-work-machine monitor section 172 is configured to transmit various motion commands, the operating state of the work-element performing apparatuses 26, etc., and so on, to the command transmission processing section 178. Further, the manufacture-work-machine monitor section 172 is configured to transmit an ON/OFF command to the plurality of indicator lamps 164. The central interface section 176 is configured to communicate with the individual interface section 210 of each of the individual control devices 90, etc., for communication of the motion command, the reply to the motion command, the abnormality of the work-element performing apparatus 26, etc., and so on, according to one protocol. The central interface section 176 is configured to transmit information as to abnormality of the work-element performing apparatus 26, etc., to the motion-command-transmission suspending section 180 and to transmit the reply to the motion command to the command transmission processing section 178.

The command transmission processing section 178 is configured to sequentially execute the transmission processing of the plurality of motion commands stored in the motion-command storage section 182. In other words, there is executed, in the command transmission processing section 178, a command-transmission processing step in a centralized control method of controlling the work-element performing apparatuses 26, etc., in a centralized manner. The command transmission processing section 178 is configured to execute transmission processing of one motion command and to execute transmission processing of a motion command to be next transmitted subsequent to the one motion command after having received a reply to the one motion command via the central interface section 176. The command transmission processing section 178 is configured to execute the transmission processing of the motion command only to the work-element performing apparatuses 26, etc., that is identified by the work-element-performing-apparatus identifying section 174. The work-element-performing-apparatus identifying section 174 is configured to transmit, to the command transmission processing section 178, information that the work-element performing apparatus is identified where the work-element-performing-apparatus identifying section 174 has obtained the identification information from the work-element performing apparatus 26, etc. Further, the motion-command-transmission suspending section 180 is configured to suspend the transmission processing of the motion command by the command transmission processing section 178 where the motion-command-transmission suspending section 180 receives information of the abnormality of any of the work-element performing apparatuses 26, etc., via the central interface section 176.

The source-data-input accepting section 184 of the auxiliary central controller 136 is configured to be connectable to an external device such as a control device different from each control device 130, etc., of the present manufacture work machine 10 or a storage medium and is configured such that the source data can be inputted thereto from the external device. The source data inputted to the source-data-input accepting section 184 is stored in the source-data storage section 186. The motion-command generating section 188 is configured to generate motion commands according to a specific programming language on the basis of the source data stored in the source-data storage section 186 and is configured to transmit the generated motion commands to the motion-command storage section 182 of the main central controller 170. The central performable-motion-information storage section 190 is configured to receive the performable-motion information of each of the work-element performing apparatuses 26, etc., from the individual control device 90, etc., of each of the work-element performing apparatuses 26, etc., via the performable-motion-information-input accepting section 192 and is configured to store the received information. The motion-command generating section 188 is configured to generate the motion commands by referring to the performable-motion information stored in the central performable-motion-information storage section 190. In other words, a motion-command generating step and a performable-motion-information obtaining step in the centralized control method of controlling the work-element performing apparatuses 26, etc., in the centralized manner are executed in the motion-command generating section 188 and the performable-motion-information-input accepting section 192, respectively. It is noted that the performable-motion-information-input accepting section 192 is also configured to be connectable to the external, device, and the performable-motion information can be inputted thereto from the external device. Further, the program change section 194 is also configured to be connectable to the external device. The program change section 194 can receive a program from the external device and can transmit the received program to the main central control device 130, the individual control device 90, etc., of each of the work-element performing apparatuses 26, etc., via the LAN cables 140.

The individual interface section 210 of each of the controllers 200, 202, 204, 206, 208 (hereinafter collectively referred to as "the controller 200, etc., where appropriate) of the individual control devices 90, etc., can communicate with the central interface section 176 of the main central control device 130 for communication of the motion command, the reply to the motion command, the abnormality of the work-element performing apparatus 26, etc., according to one protocol, and also can communicate with the performable-motion-information-input accepting section 192 of the auxiliary central controller 136 for communication of the performable-motion information stored in the individual performable-motion-information storage section 216. The command converting section 218 is configured to convert the motion command received by the individual interface section 210 into a motion command in a programming language understandable for the individual control device 100, etc. of itself. In other words, in the command converting section 218, there is executed a command converting process in an independent control method of independently controlling the work-element performing apparatuses. In the present manufacture work machine 10, while the command converting section 218 is provided in the individual control device 100, etc., a motion converting device having a function similar to the command converting section 218 may be provided outside the individual control device 100, etc. Where the motion converting device having the function similar to the command converting section 218 is provided outside the individual control device 100, etc., an individual interface section is provided in the motion converting device, and the motion converting device and the central control device communicate with each other for communication of the motion command, the reply to the motion command, the abnormality of the work-element performing apparatus 26, etc., according to one protocol.

The operation control section 214 of each of the mounter controller 202, the dispenser controller 204, the supplier controller 206, and the conveyor controller 208 is configured to control the operation of the operating device on the basis of the motion command converted by the command converting section 218. The operation control section 214 of each of the moving-device controller 200 and the camera-device controller 116 is configured to control the operation of the operating device on the basis of the motion command received by the individual interface section 210. In the identification-information storage section 212, the identification information is stored. The stored identification information is configured to be transmitted to the work-element-performing-apparatus identifying section 174 of the main central controller via the individual interface section 210.

The processing by the main central controller 170, specifically, the processing for transmitting the motion commands, more specifically, a transmission program for executing the processing for monitoring the operating state of the manufacture work machine so as to transmit the motion commands, is described in a graphic-type programming language. On the other hand, the processing by the auxiliary central controller 136, more specifically, a generation program for executing the processing by the motion-command generating section is described in a structured-type programming language. The graphic-type programming language is a programming language that is generally easier than the structured-type programming language, and is considered as a high-level programming language. That is, it is possible to comparatively easily change the transmission program. In the present manufacture work machine 10, the programming language of the transmission program, is a ladder language while the programming language of the generation program is a C language.

<Replacement of the Work-Element Performing Apparatus>

Figure 10:
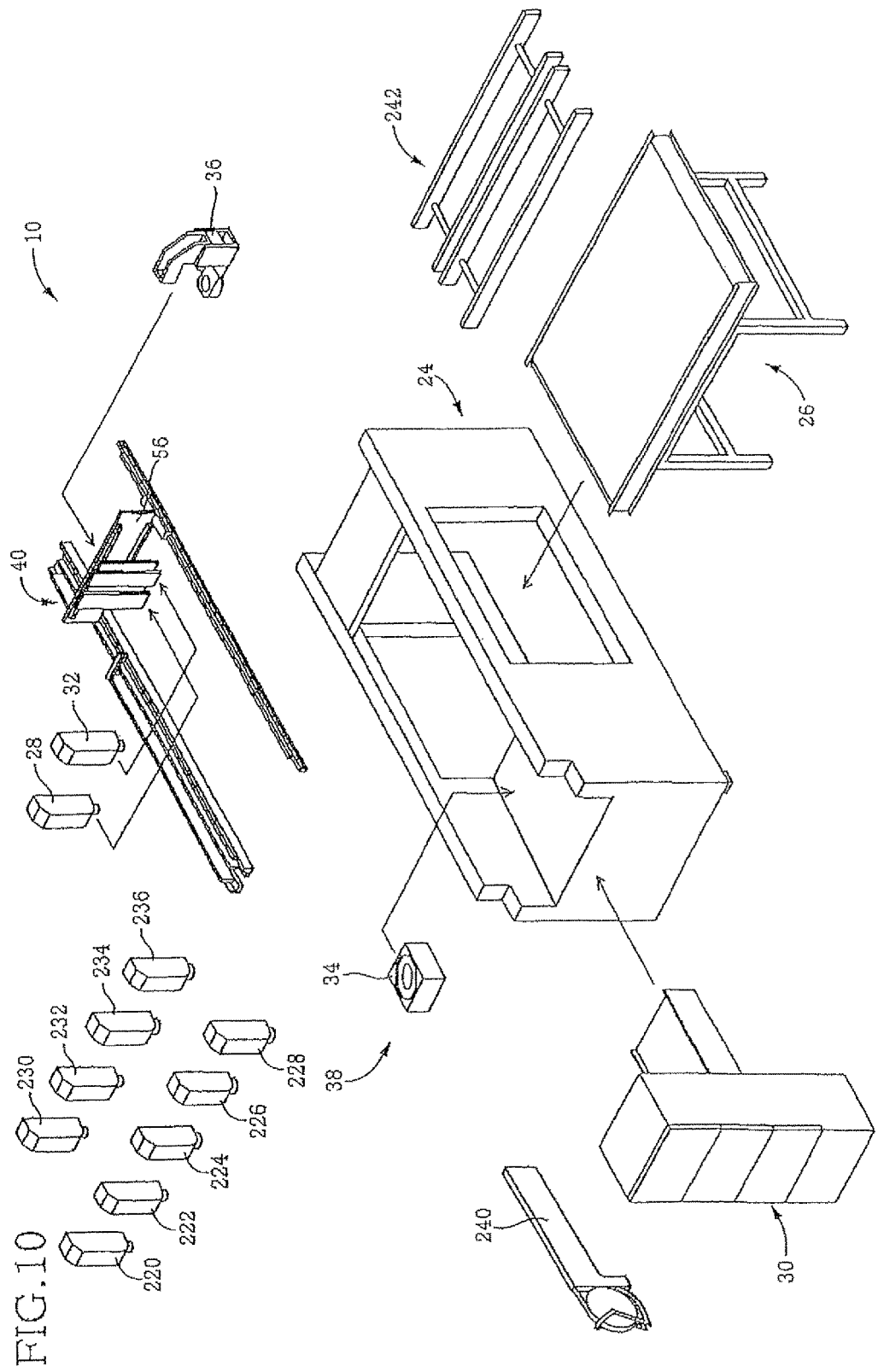
FIG. 10 is a perspective view showing a base of the manufacture work machine of FIG. 1 and the plurality of work-element performing apparatuses in a state in which the apparatuses are detached from the base.

In the present manufacture work machine 10, as shown in FIG. 10, the conveyor 26, the supplier 30, the moving device 40, and the base camera 34 of the camera device 38 are attachable to and detachable from the main body 24 while the mounter 28, the dispenser 32, and the head camera 36 of the camera device 38 are attachable to and detachable from the slider 56 of the moving device 40. Some of those work-element performing apparatuses 26, etc., are attachable and detachable with one-touch action while the other of those are fixed by several bolts. All of the work-element performing apparatuses 26, etc., are constructed so as to be easily attached to and detached from the main body 24 or the slider 56.

To the position at which the mounter 28 or the dispenser 32 is attached, namely, to the slider 56, other work-element performing apparatuses can be attached in place of the mounter 28 or the dispenser 32. To be more specific, the mounter 28 or the dispenser 32 can be exchanged with: a high-frequency welder 220 for performing a heat treatment by a high-frequency wave; a laser generator 222 for performing laser processing; a UV irradiator 224 for performing processing by UV irradiation; a hot-air blower 226 for performing a heat treatment by applying hot air; a screw fastener 228 for performing screw fastening processing; a screw attaching/fastening device 230 for performing screw holding and separation and screw fastening processing in a state in which a screw is held; a double dispenser 232 having two dispenser nozzles and configured to perform ejection of two kinds of auxiliary agents; a mounter 234 for holding and separating another component and for performing adjustment of a component hold position; and a solder cream printer 236, for instance.

As described above, in the present manufacture work machine 10, two work-element performing apparatuses are attachable to the slider 56, and it is possible to operate the two work-element performing apparatuses in a cooperative manner, depending upon the kind of the two work-element performing apparatuses. The cooperative work by the two work-element performing apparatuses means that, while permitting the work object to be fixed by holding by one of the two work-element performing apparatuses, the processing/treatment is performed by the other of the two work-element performing apparatuses, for instance. When the work is performed as if both hands are used, it is possible to perform, while holding the work object by one hand so as to prevent the work object from moving, the processing/treatment by the other hand. More specifically, where the mounter 28 and the laser generator 222 are attached to the slider 56, for instance, it is possible to perform the laser processing on a base member by the laser generator 222 while permitting the mounter 28 to press the base member. Where the mounter 28 and the screw attaching/fastening device 230 are attached to the slider 56, for instance, it is possible to perform the screw fastening processing by the screw attaching/fastening device 230 while permitting the mounter 28 to press the base member.

In place of the supplier 30, other kinds of suppliers, more specifically, a tape feeder 240, a ball feeder, a screw supplier, a stacking unit (not shown) and the like can be attached, for instance. In place of the conveyor 26, other kinds of conveyors, more specifically, a double conveyer 242 of a module type, a single conveyor, a conveyor with an elevating and lowering function (not shown) and the like can be attached, for instance. In place of the moving device 40, other kinds of moving devices, more specifically, a moving device of an XY-robot type (not shown) and the like can be attached, for instance. The head camera 36 and the base camera 34 can be replaced with other cameras. Accordingly, where there arises a need of manufacturing a new product and it becomes necessary to perform a work for fixing a component by a screw to a base member in place of the mounting work with respect to the circuit substrate, the manufacture work can be changed not by changing the manufacture work machine per se, but by replacing the dispenser 32 with the screw attaching/fastening device 230.

Each of the above-described plurality of work-element performing apparatuses 220-236 (hereinafter collectively referred to as the "work-element performing apparatus 220, etc., where appropriate), which are replaceable with the six work-element performing apparatuses 26, etc., including the conveyor 26, the mounter 28 and so on that constitute the present manufacture work machine 10, has an individual control device configured to control an operation of itself, like the six work-element performing apparatuses 26, etc. Some of the individual control devices of the above-described replaceable work-element performing apparatuses 220, etc., can handle the programming language that defines the motion command transmitted by the main central control device 130. Each of other individual control devices which cannot handle the programming language that defines the motion command transmitted by the main central control device 130 has a function of converting the received motion command into a motion command according to a programming language which the individual control device can handle, like the above-described mounter control device 100, etc., so as to control the operation of the work-element performing apparatus on the basis of the motion command converted by itself. That is, even if the work-element performing apparatus 26, etc., of the present manufacture work machine 10 is replaced with another work-element performing apparatus 220, etc., more specifically, even if the dispenser 32 is replaced with the screw attaching/fastening device 230 as described above, the main central control device 130 may transmit the motion command according to the programming language which has been used to the individual control device of the screw attaching/fastening device 230.

Some of the individual control devices of the above-described replaceable work-element performing apparatuses 220, etc., include the individual performable-motion-information storage sections in each of which is stored the performable-motion information of each work-element performing apparatus, and are configured to transmit the performable-motion information stored in the respective individual performable-motion-information storage sections to the central performable-motion-information storage section 190 of the auxiliary central controller 136. For each of other individual control devices of the replaceable work-element performing apparatuses which does not include the individual performable-motion-information storage section, the performable-motion information can be inputted from the external device to the performable-motion-information-input accepting section 192 of the auxiliary central controller 136. Accordingly, it is possible to store the performable-motion information of the work-element performing apparatus which does not include the individual performable-motion-information storage section in the central performable-motion-information storage section 190. In other words, even where the work-element performing apparatus 26, etc., of the present manufacture work machine 10 is replaced with the other work-element performing apparatuses 220, etc., it is possible to refer to the performable-motion information of each of the other work-element performing apparatuses in generating the motion command.

To each of the plurality of work-element performing apparatuses 220, etc., which are attachable in place of the six work-element performing apparatuses 26, etc., that constitute the present manufacture work machine 10, the serial cable 134, the LAN cable 140, and the I/O cable 160 can be connected. Moreover, the individual control device of each of all work-element performing apparatuses 26, 220, etc., except the camera device 38, is incorporated in or attached to the main body which performs the work element. That is, all of the work-element performing apparatuses 26, 220, etc., except the camera device 38, is constructed to constitute a unit. Therefore, where the work-element performing apparatus is replaced, more specifically, where the dispenser 32 is replaced with the screw attaching/fastening device 230, the cables 134, 140, 160 are disconnected from the dispenser 32 and connected to the screw attaching/fastening device 230, whereby replacement of the work-element performing apparatus can be completed.

Where the work-element performing apparatus is replaced, there is an instance in which it is desired to change the monitoring manner of the operating state of the manufacture work machine as needed. In such an instance, it may be sometimes desirable to change the transmission program. As described above, the transmission program is described in the graphic language which is comparatively easy, so that it is easily changeable. Accordingly, even where the transmission program of the central control device needs to be changed in association with the replacement of the work-element performing apparatus, the work-element performing apparatus can be replaced without a great deal of trouble.

<Manufacture Work System Constituted by a Plurality of Manufacture Work Machines>

In the single manufacture work machine 10, the number of manufacture steps that can be performed is comparatively small. However, a relatively large number of manufacture steps can be performed by constructing a manufacture work system in which the manufacture work machine which is the same as the above-described manufacture work machine 10, or the manufacture work machine in which the work-element performing apparatuses in the above-described manufacture work machine 10 are replaced, etc., is arranged in a plural number and in which the manufacture works by the plurality of manufacture work machines are sequentially performed on a base member while conveying the base member from the upstream-side manufacture work machines toward the downstream-side manufacture work machines. In other words, it is possible to produce products or components with a certain degree of complexity. Further, it is possible to construct an optimum work process in accordance with a product to be produced and to select the manufacture work machine and the plurality of work-element performing apparatuses that constitute each of the manufacture work machines such that the optimum work process can be appropriately performed. In the present description, an assembling system is explained as the thus constructed manufacture work system. More specifically, there will be hereinafter explained the systems, namely, a system for performing assembling of an LED lamp, a system for performing assembling of a power module, and a system for performing assembling of a solar cell, by performing an assembling work as the manufacture work in each manufacture work machine.

i) LED-Lamp Assembling System

Figure 11:
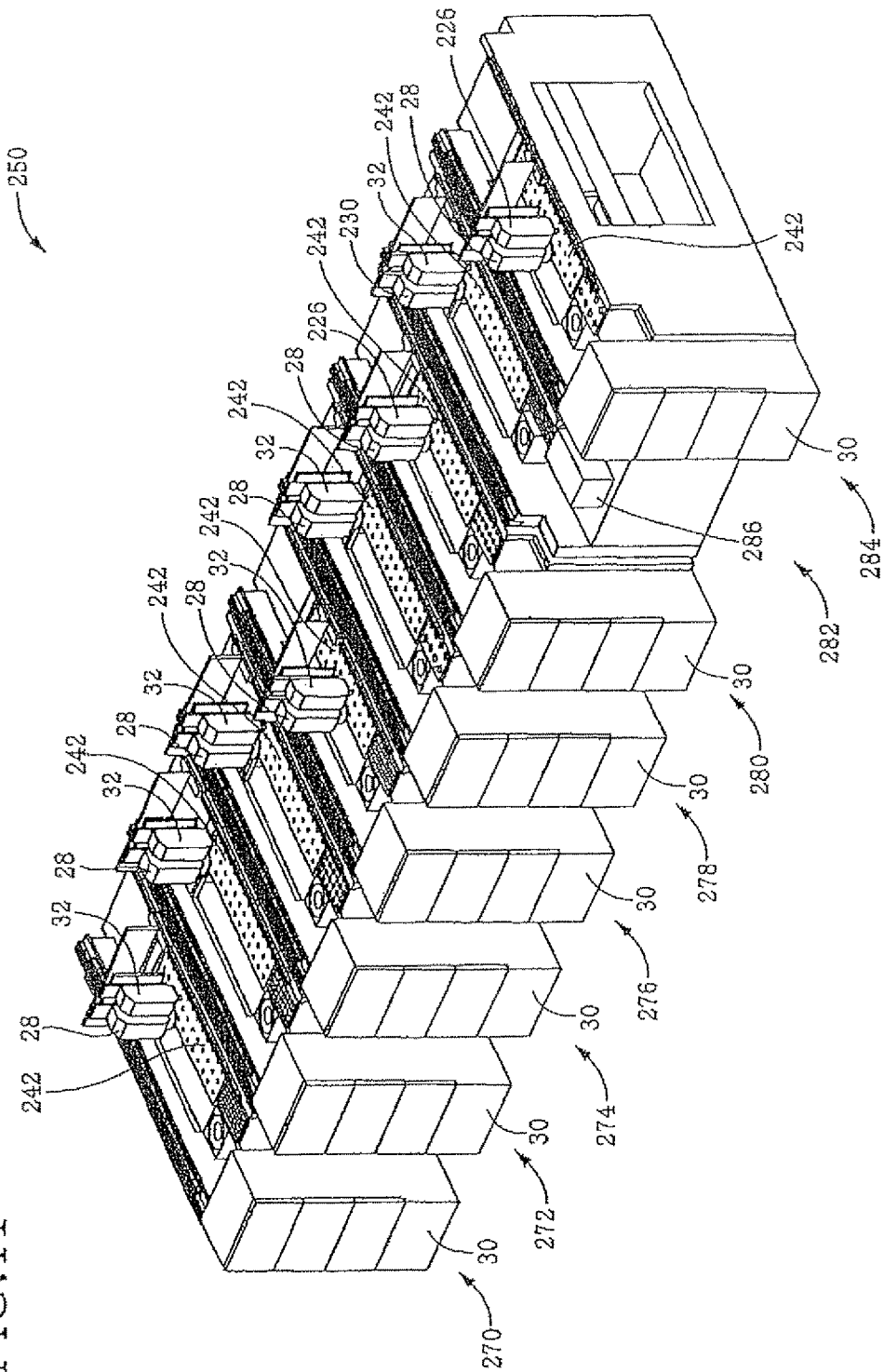
FIG. 11 is a perspective view showing an LED-lamp assembling system constituted by a plurality of manufacture work machines.
Figure 12:
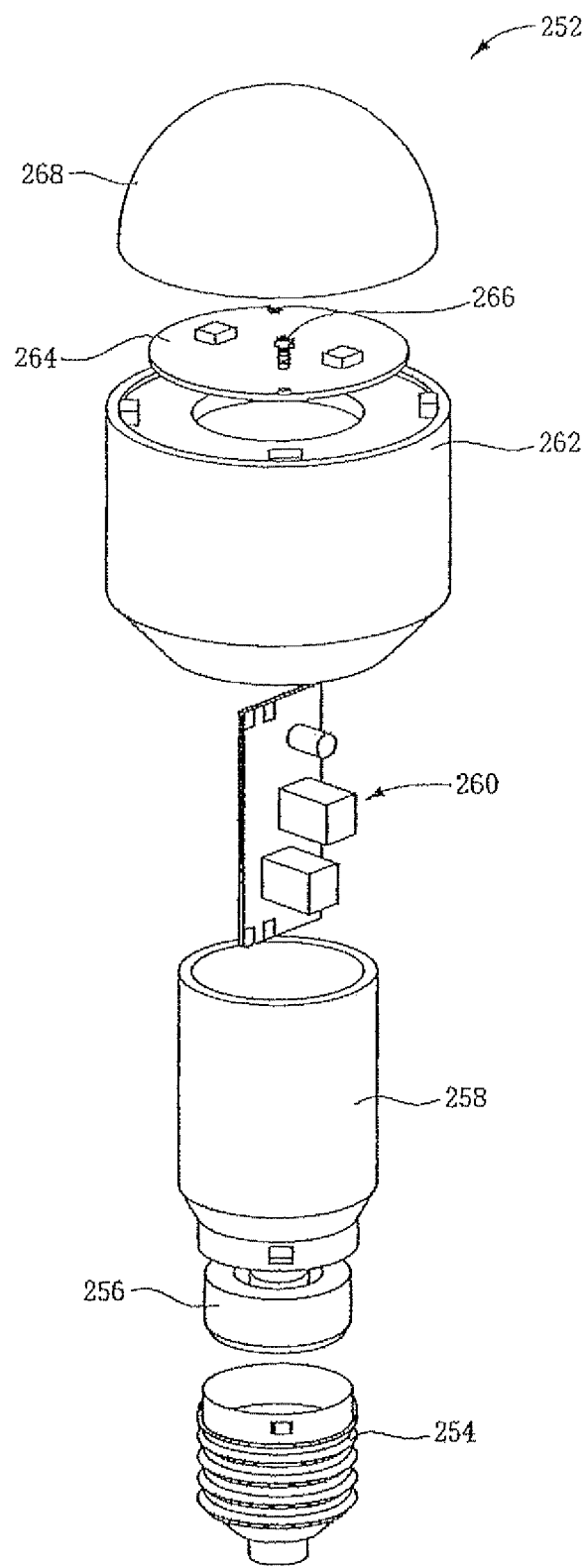
FIG. 12 is an exploded view of an LED lamp assembled by the LED-lamp assembling system of FIG. 11.

FIG. 11 is a perspective view of an LED-lamp assembling system 250 and FIG. 12 is an exploded view of an LED lamp 252 assembled by the LED-lamp assembling system 250. As shown in FIG. 12, the LED lamp 252 includes: a terminal socket 254 having a cylindrical shape with a closed end; a terminal 256 provided in the terminal socket 254; a cylindrical casing 258 fitted onto an upper end of the terminal socket 254; a terminal-attached circuit board 260 provided in the casing 258; a heat sink 262 fixed to an upper end portion of the casing 258 by an adhesive; a terminal-attached LED board 264 disposed on an upper end face of the heat sink 262; a screw 266 for fixing the LED board 264 to the heat sink 262; and a semi-spherical cover 268 fixed to an upper end portion of the heat sink 262 by an adhesive.

As shown in FIG. 11, the LED-lamp assembling system 250 is constituted by eight manufacture work machines. The eight manufacture work machines are a first manufacture work machine 270, a second manufacture work machine 272, a third manufacture work machine 274, a fourth manufacture work machine 276, a fifth manufacture work machine 278, a sixth manufacture work machine 280, a seventh manufacture work machine 282, and an eighth manufacture work machine 284, which are arranged in this order from the upstream side (the left-hand side in FIG. 11). In each of the first manufacture work machine 270, the second manufacture work machine 272, the third manufacture work machine 274, the fourth manufacture work machine 276, and the fifth manufacture work machine 278, the double conveyer 242 of the module type is used in place of the conveyer 26 used in the above-described manufacture work machine 10. In each of the sixth manufacture work machine 280 and the eighth manufacture work machine 284, the double conveyer 242 and the hot-air blower 226 are used in place of the conveyor 26 and the dispenser 32 of the above-described manufacture work machine 10, respectively. In the seventh manufacture work machine 282, the double conveyer 242, the screw attaching/fastening device 230, and a screw supplier 286 are used in place of the conveyor 26, the mounter 28, and the supplier 30 of the above-described manufacture work machine 10, respectively.

The first manufacture work machine 270 is configured to perform a manufacture work for placing the terminal socket 254 as a base member on a specific position of the double conveyer 242. In the first manufacture work machine 270, there are sequentially transmitted: a motion command for supplying a tray on which the terminal socket 254 is placed; a motion command for moving the mounter 28 to a position at which the terminal socket 254 is supplied; a motion command for holding the terminal socket 254 placed on the tray; a motion command for moving the mounter 28 that holds the terminal socket 254 above the base camera 34; a motion command for taking, by the base camera 34, an image of the terminal socket 254 held by the mounter 28 and obtaining information of a hold state of the terminal socket 254; a motion command for moving the mounter 28 to a specific position above the double conveyer 242; a motion command for separating the terminal socket 254 at the specific position on the double conveyer 242; and a motion command for conveying the terminal socket 254 placed on the double conveyer 242. The work-element performing apparatuses 242, etc., perform their work elements in accordance with the corresponding motion commands, whereby the terminal socket 254 placed on the double conveyer 242 is conveyed to the second manufacture work machine 272. Since the motion commands to the camera device 38, the moving device 40, and the double conveyer 242 are substantially the same in each of the manufacture work machines 270, etc., an explanation of those motion commands are dispensed with.

The second manufacture work machine 272 is configured to perform a manufacture work for mounting the terminal 256 onto the terminal socket 254 as the base member. In the second manufacture work machine 272, there are sequentially transmitted: a motion command for supplying a tray on which the terminal 256 is placed: a motion command for holding the terminal 256 placed on the tray; and a motion command for separating the terminal 256 in the terminal socket 254, whereby the respective work elements are performed, so that the terminal socket 254 onto which the terminal 256 has been mounted is conveyed to the third manufacture work machine 274.

The third manufacture work machine 274 is configured to perform a manufacture work for mounting the casing 258 into the terminal socket 254 onto which the terminal 256 has been mounted. The fourth manufacture work machine 276 is configured to perform a manufacture work for mounting the circuit board 260 into the casing 258. Since the motion commands in each of the third manufacture work machine 274 and the fourth manufacture work machine 276 are similar to the motion commands in the above-described second manufacture work machine 272, an explanation thereof is dispensed with. It is noted that the dispenser 32 of each of the first manufacture work machine 270, the second manufacture work machine 272, the third manufacture work machine 274, and the fourth manufacture work machine 276 does not operate in the assembling work of the LED lamp 252.

The fifth manufacture work machine 278 is configured to perform a manufacture work for fixing the heat sink 262 to the upper end portion of the casing 258 by the adhesive. In the fifth manufacture work machine 278, there are sequentially transmitted: a motion command for applying the adhesive to the upper end portion of the casing 258; a motion command for supplying a tray on which the heat sink 262 is placed; a motion command for holding the heat sink 262 placed on the tray; and a motion command for separating the heat sink 262 at the upper end portion of the casing 258 to which the adhesive has been applied, whereby the respective work elements are performed, so that the LED lamp 252 in which the fixing work of the heat sink 262 by the adhesive has been completed is conveyed to the sixth manufacture work machine 280.

The sixth manufacture work machine 280 is configured to perform a manufacture work for drying the adhesive applied in the fifth manufacture work machine 278 and for placing the LED board 264 onto the upper end face of the heat sink 262. In the sixth manufacture work machine 280, there are sequentially transmitted: a motion command for drying the adhesive by which the casing 258 and the heat sink 262 are bonded; a motion command for supplying a tray on which the LED board 264 is placed; a motion command for holding the LED board 264 placed on the tray; and a motion command for separating the LED board 264 onto the upper end face of the heat sink 262, whereby the respective work elements are performed, so that the LED lamp 252 in which the drying work and the placing work of the LED board 264 have been completed is conveyed to the seventh manufacture work machine 282. In the motion command for drying the adhesive, the main command is for commanding initiation of application of hot air by the hot-air blower 226 while the associated command is for commanding a blow time. As the associated command, there may be employed various motion parameters such as a blow temperature, a blow direction, and a blow force.

The seventh manufacture work machine 282 is configured to perform a manufacture work for fixing the LED board 264 to the heat sink 262 by the screw 266 and for applying, to the heat sink 262, the adhesive for fixing the cover 268 to be mounted in the eighth manufacture work machine 284. In the seventh manufacture work machine 282, there are sequentially transmitted: a motion command for supplying the screw 266; a motion command for holding the screw 266 supplied by the screw supplier 286; a motion command for performing screw fastening; a motion command for separating the screw 266; and a motion command for applying the adhesive to the upper end of the heat sink 262, whereby the respective work elements acre performed, so that the LED lamp 252 in which the screw fastening work and the adhesive application work have been completed is conveyed to the eighth manufacture work machine 284. In the motion command for performing the screw fastening, the main command is for commanding initiation of the screw fastening while the associated command is for commanding a time of the screw fastening. As the associated command, there may be employed various motion parameters such as a rotation speed, a rotation torque, etc., in the screw fastening.

The eighth manufacture work machine 284 is configured to perform a manufacture work for mounting the cover 268 to the position at which the adhesive has been applied in the seventh manufacture work machine 278 and for drying the adhesive. In the eighth manufacture work machine 284, there are sequentially transmitted: a motion command for supplying a tray on which the cover 268 is placed; a motion command for holding the cover 268 placed on the tray: a motion command for separating the cover 268 onto the position on the heat sink 262 to which the adhesive has been applied; and a motion command for drying the adhesive, whereby the respective work elements are performed, so that the finished LED lamp 252 is conveyed out of the eighth manufacture work machine 284.

ii) Power-Module Assembling System

Figure 13:
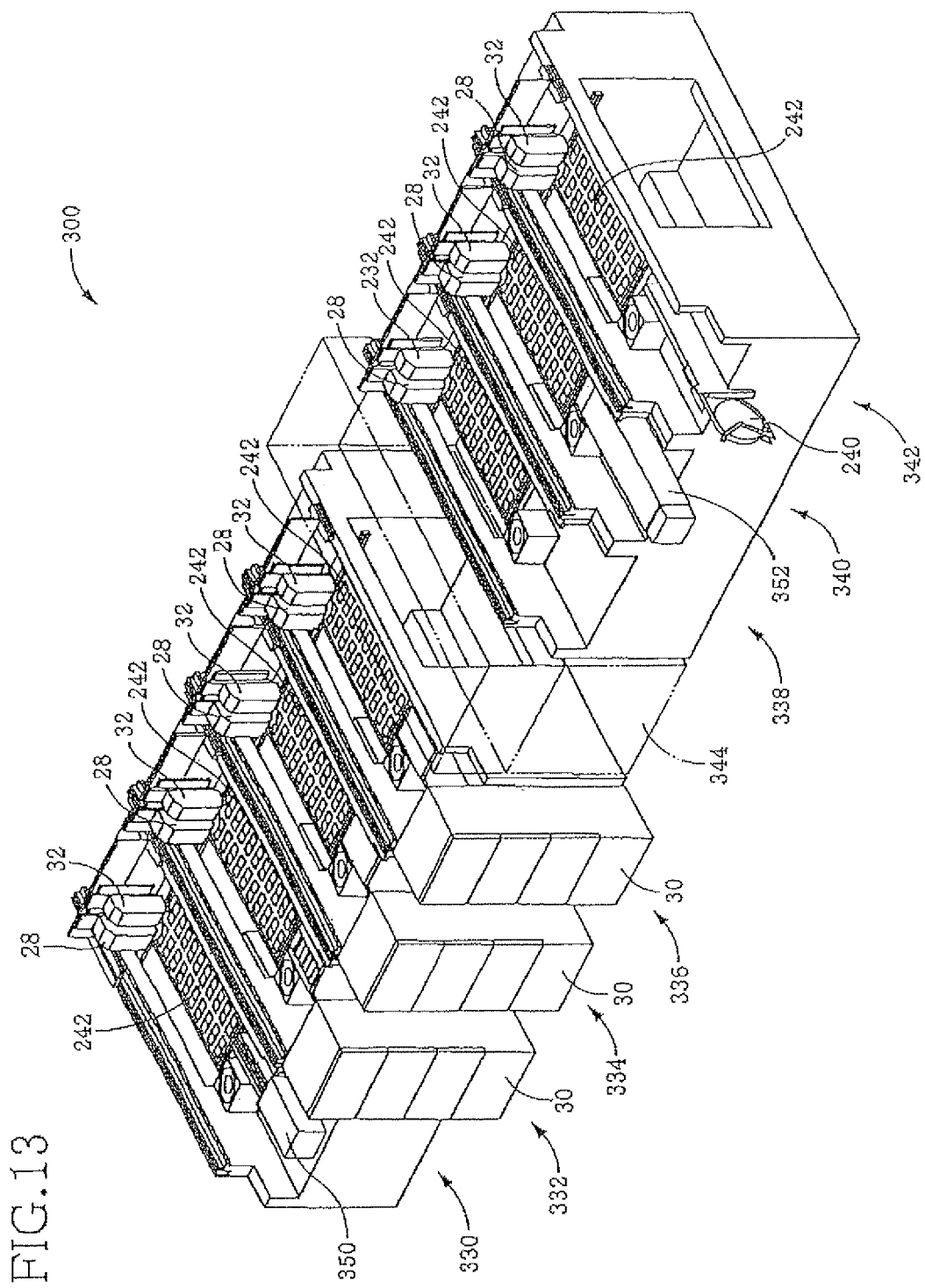
FIG. 13 is a perspective view showing a power-module assembling system constituted by a plurality of manufacture work machines.
Figure 14:
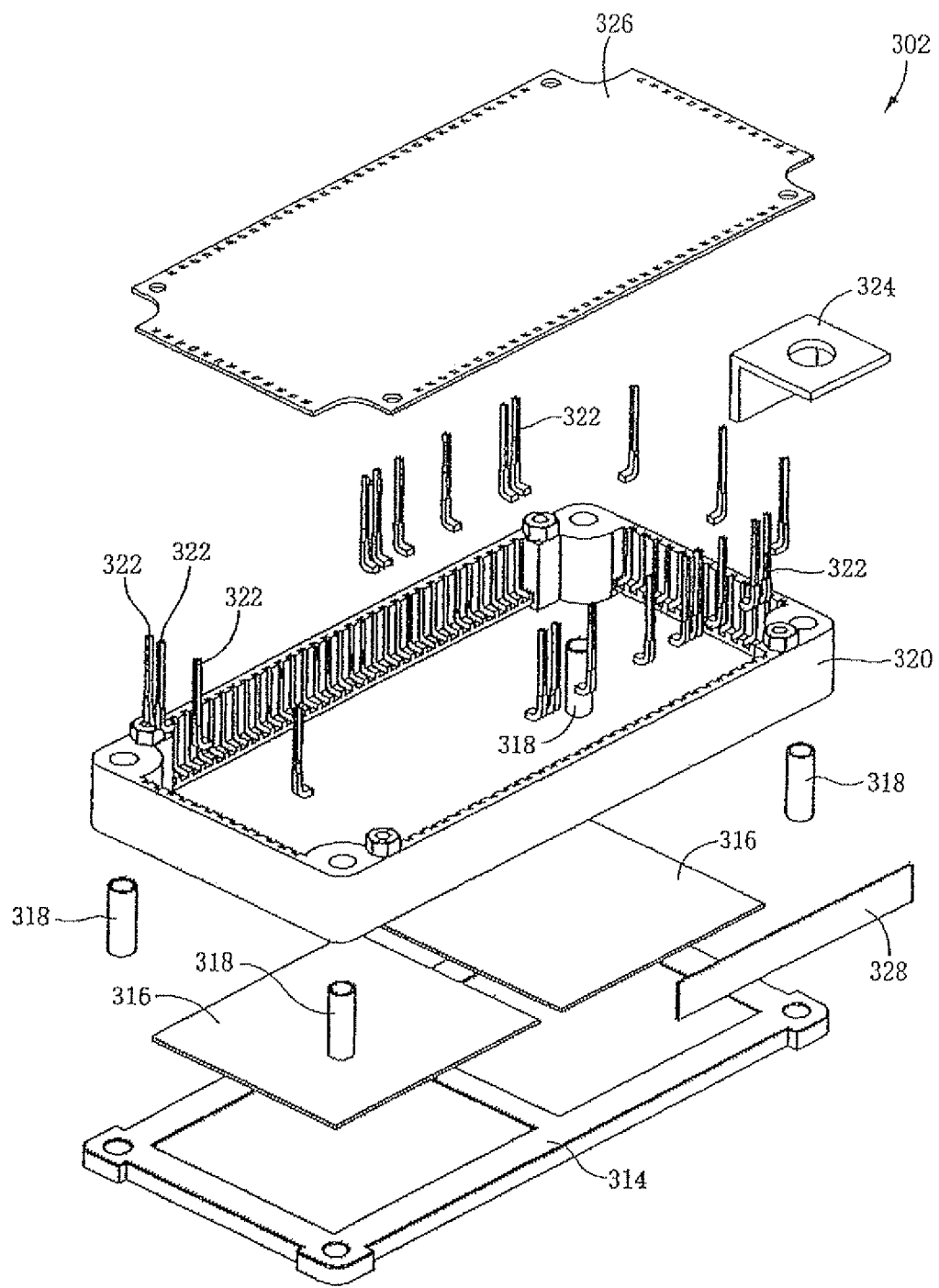
FIG. 14 is an exploded view of a power module assembled by the power-module assembling system of FIG. 13.

FIG. 13 is a perspective view of a power-module assembling system 300. FIG. 14 is an exploded view of a power module 302 assembled by the power module assembling system 300. As shown in FIG. 14, the power module 302 is constituted by: a base plate 314; an insulation substrate 316 soldered to the base plate 314; four bushings 318 fitted into respective four holes formed at respective four corners of the base plate 314; a casing 320 fixed onto the base plate 314 by the four bushings 318; a plurality of pin terminals 322 attached to the casing 320; a terminal 324 mounted into the casing 320; a lid 326 covering an upper portion of the casing 320; and a seal 328 attached to a side surface of the casing 320.

As shown in FIG. 13, the power module assembling system. 300 is constituted by seven manufacture work machines 330-342 and a wire bonding machine 344. The seven manufacture work machines 330-342 are a first manufacture work machine 330, a second manufacture work machine 332, a third manufacture work machine 334, a fourth manufacture work machine 336, a fifth manufacture work machine 338, a sixth manufacture work machine 340, and a seventh manufacture work machine 342, which are arranged in this order from the upstream side (the left-hand side in FIG. 13). The wire bonding machine 344 which is disposed between the fourth manufacture work machine 336 and the fifth manufacture work machine 338 is not relevant to the present invention and is illustrated by the long dashed double-short dashed line in FIG. 13.

In the first manufacture work machine 330, the double conveyer 242 of the module type and a bushing supplier 350 for supplying the bushings 318 are used in place of the conveyor 26 and the supplier 30 of the manufacture work machine 10, respectively. In each of the second manufacture work machine 332, the third manufacture work machine 334, and the fourth manufacture work machine 336, the double conveyer 242 is used in place of the conveyor 26 of the manufacture work machine 10. In the fifth manufacture work machine 338, the double conveyer 242 and the double dispenser 232 are used in place of the conveyor 26 and the dispenser 32 of the manufacture work machine 10, respectively, and the supplier 30 used in the manufacture work machine 10 is detached. In the sixth manufacture work machine 340, the double conveyer 242 and a lid supplier 352 for supplying the lid 326 are used in place of the conveyor 26 and the supplier 30 of the manufacture work machine 10, respectively. In the seventh manufacture work machine 342, the double conveyer 242 and the tape feeder 240 are used in place of the conveyor 26 and the supplier 30 of the manufacture work machine 10, respectively.

In the power-module assembling system 300, the insulation substrate 316 is soldered to the base plate 314 in advance, and the base plate 314 to which the insulation substrate 316 is attached is fed into the first manufacture work machine 330 as a base member. The first manufacture work machine 330 is configured to perform a manufacture work for mounting the four bushings 318 into the respective four corners of the base plate 314 to which the insulation substrate 316 is attached. The second manufacture work machine 332 is configured to perform a manufacture work for mounting the casing 320 onto the base plate 314 such that the four bushings 318 are fitted into the respective four holes formed at the four corners of the casing 320. The third manufacture work machine 334 is configured to perform a manufacture work for attaching the plurality of pin terminals 322 into the casing 320. The fourth manufacture work machine 336 is configured to perform a manufacture work for mounting the terminal 324 into the casing 320. When the manufacture work by the fourth manufacture work machine 336 is completed, the wire bonding machine 344 performs wire bonding processing.

The power module 302 which has been subjected to the wire bonding processing is fed into the fifth manufacture work machine 338. The fifth manufacture work machine 338 is configured to perform a manufacture work for ejecting two kinds of auxiliary agents, i.e., silicone gel and epoxy resin, into the casing 320. The sixth manufacture work machine 340 is configured to perform a manufacture work for mounting the lid 326 onto the upper portion of the casing 320. The seventh manufacture work machine 342 is configured to perform a manufacture work for attaching the seal 328 to the side surface of the casing 320. When the manufacture work by the seventh manufacture work machine 342 is completed, the finished power module 302 is conveyed out of the seventh manufacture work machine 342. Since the motion commands in the manufacture work machines 330-342 of the present system 300 are similar to the motion commands in the manufacture work machines 270-284 of the above-described LED-lamp assembling system 250, an explanation relating to the motion commands in the present system 300 is dispensed with.

Where there arises a need to produce, for some reasons, the power module 302 in place of the LED lamp 252 in a factory in which the LED lamps 252 are produced by the LED-lamp assembling system 250 as explained above, the power-module assembling system 300 can be established utilizing most of the manufacture work machines 270-284 that constitute the LED-lamp assembling system 250 without discarding the same 250. To put it concretely, since the second through fourth manufacture work machines 272-276 in the LED-lamp assembling system 250 are same as the second through fourth manufacture work machines 332-336 in the power-module assembling system 300, the second through fourth manufacture work machines 272-276 can be utilized as they are, in the power-module assembling system 300. The first manufacture work machine 270 in the LED-lamp assembling system 250 is the same as the first manufacture work machine 330 in the power-module assembling system 300 except for the supplier 30. Accordingly, by newly purchasing the bushing supplier 350, the first manufacture work machine 270 can be utilized in the power-module assembling system 300. The fifth manufacture work machine 278 in the LED-lamp assembling system 250 is the same as the sixth manufacture work machine 340 in the power-module assembling system 300 except for the supplier 30. Accordingly, by newly purchasing the lid supplier 352, the fifth manufacture work machine 278 can be utilized in the power-module assembling system 300. The sixth manufacture work machine 280 in the LED-lamp assembling system 250 is the same as the fifth manufacture work machine 338 in the power-module assembling system 300 except for the supplier 30 and the hot-air blower 226. Accordingly, by newly purchasing the double dispenser 232, the sixth manufacture work machine 280 can be utilized in the power-module assembling system 300. The supplier 30 is detached. The eighth manufacture work machine 284 in the LED-lamp assembling system 250 is the same as the seventh manufacture work machine 342 in the power-module assembling system 300 except for the supplier 30 and the hot-air blower 226. By utilizing the dispenser 32 of the seventh manufacture work machine 286 in the LED damp assembling system 250 and newly purchasing the tape feeder 240, the eighth manufacture work machine 284 can be utilized in the power-module assembling system 300. In short, the LED-lamp assembling system 250 can be utilized as the power-module assembling system 300 simply by newly purchasing the bushing supplier 350, the lid supplier 352, the double dispenser 232, and the tape feeder 240.

As explained above, in the manufacture work machine in the present description, the source data can be easily rewritten, and the rewritten source data can be inputted into the central control device of the manufacture work machine, so that it is possible to easily deal with the change of the manufacture work. Moreover, the work-element performing apparatuses 350, etc., to be newly purchased can be easily attached to the manufacture work machine owing to employment of the commonly used interfaces. Thus, the manufacture work machine in the present description can suitably deal with the change of the manufacture work in terms of the cost, the environment, ease, and so on.

iii) Solar-Cell Assembling System

Figure 15:
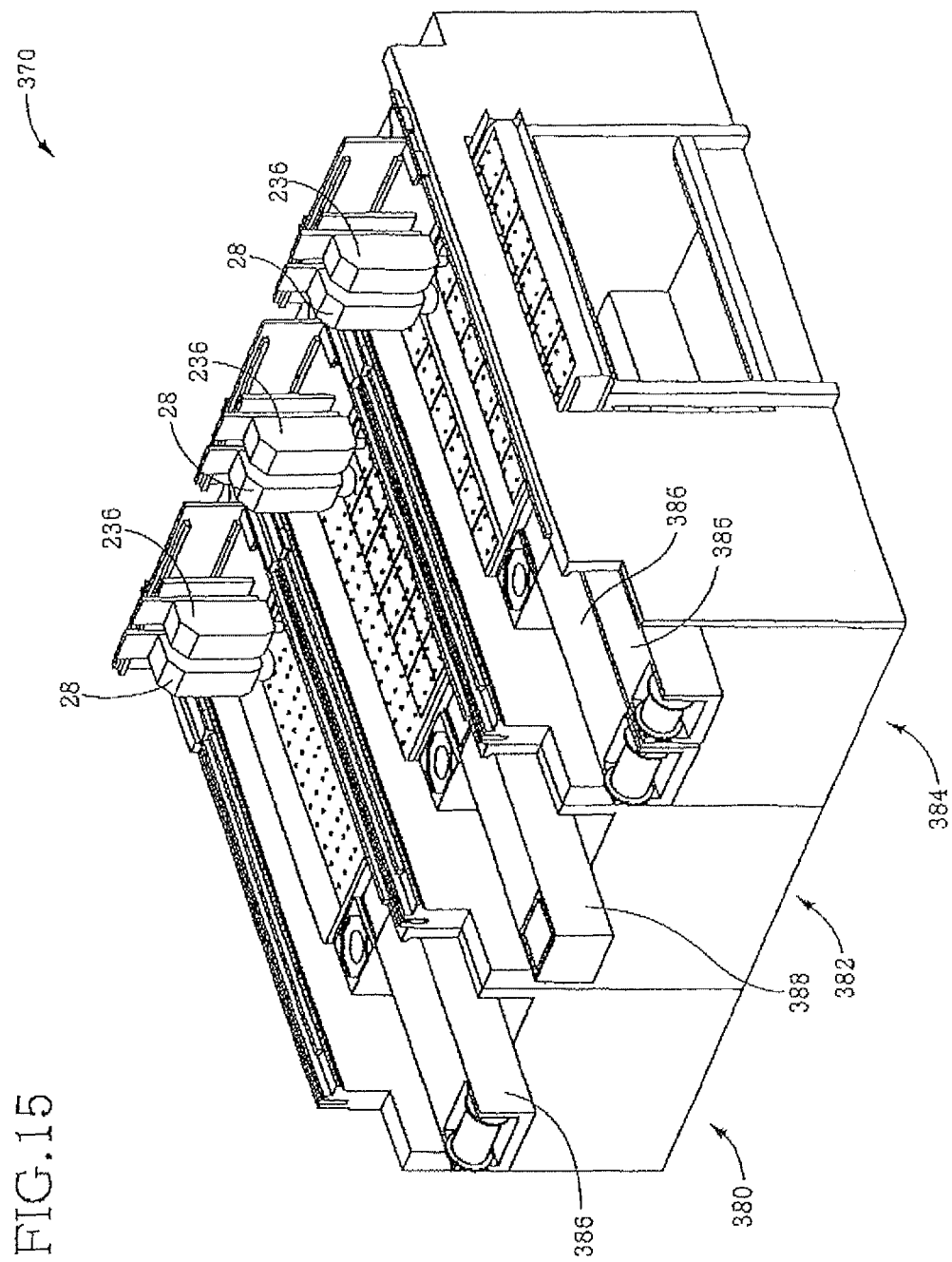
FIG. 15 is a perspective view showing a solar-cell assembling system constituted by a plurality of manufacture work machines.
Figure 16:
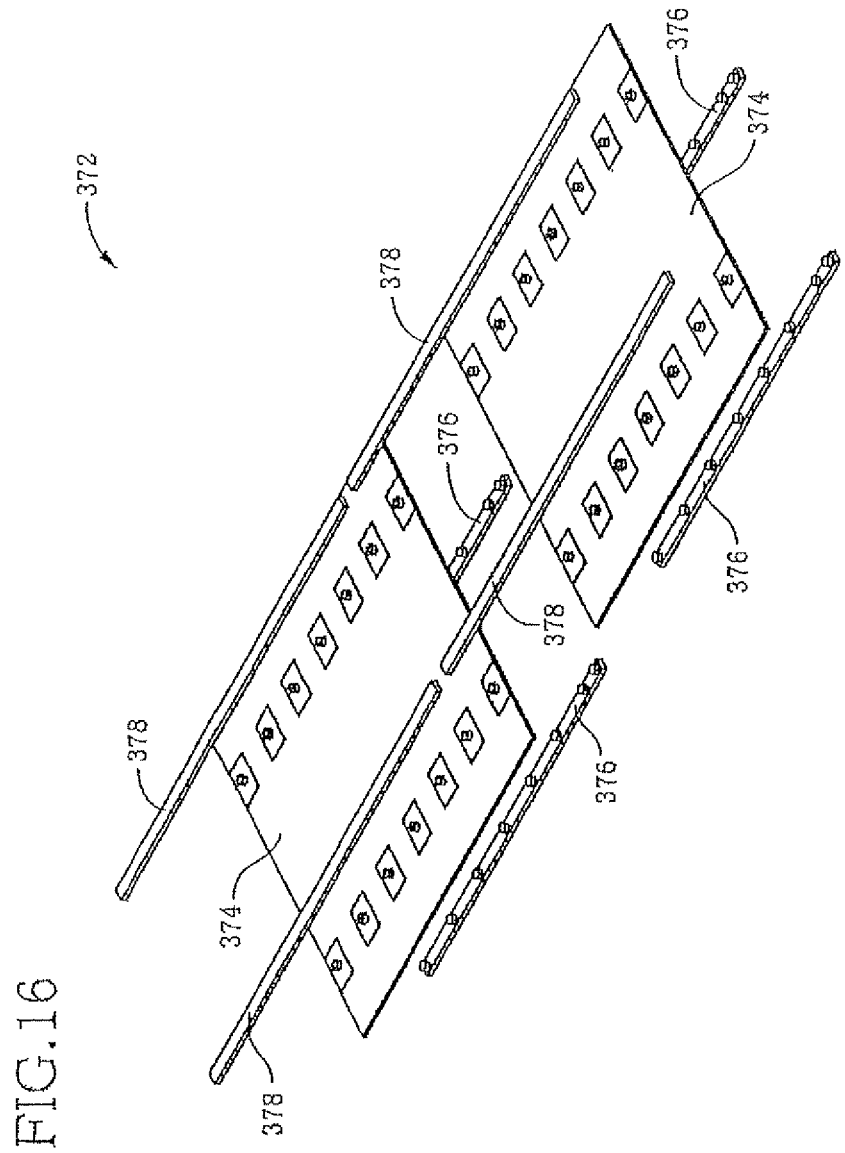
FIG. 16 is an exploded view of a solar cell assembled by the solar-cell assembling system of FIG. 15.

FIG. 15 is a perspective view of a solar-cell assembling system 370. FIG. 16 is an exploded view of a solar cell 372 produced by the solar-cell assembling system 370. As shown in FIG. 16, the solar cell 372 is constituted by: a silicon cell 374; lower interconnectors 376 soldered to a lower surface of the silicon cell 374; and upper interconnectors 378 soldered to an upper surface of the silicon cell 374. The solar-cell assembling system 370 is constituted by three manufacture work machines, as shown in FIG. 15. The three manufacture work machines are a first manufacture work machine 380, a second manufacture work machine 382, and a third manufacture work machine 384, which are arranged in this order from the upstream side (the left-hand side in FIG. 15). In the first manufacture work machine 380, the solder cream printer 236 and an interconnector supplier 386 for supplying an interconnector are used in place of the dispenser 32 and the supplier 30 of the manufacture work machine 10, respectively. In the second manufacture work machine 382, the solder cream printer 236 and a silicon-cell supplier 388 for supplying the silicon cell 374 are used in place of the dispenser 32 and the supplier 30 of the manufacture work machine 10, respectively. In the third manufacture work machine 384, the solder cream printer 236 is used in place of the dispenser 32 of the manufacture work machine 10, and two interconnector suppliers 386 are used in place of the supplier 30 of the manufacture work machine 10.

The first manufacture work machine 380 is configured to perform a manufacture work for placing the lower interconnectors 376, each as a base member, to respective specific positions on the conveyor belt 50 of the mounter 26 and for printing solder cream on all portions on the upper surface of each lower interconnector 376 to which the solder cream should be applied. The second manufacture work machine 382 is configured to perform a manufacture work for mounting the silicon cell 374 on the lower interconnectors 376 to which the solder cream has been printed and for printing the solder cream on a part of portions of the upper surface of the silicon cell 374 on which the solder cream should be printed. The third manufacture work machine 384 is configured to perform a manufacture work for printing the solder cream on the rest of the portions of the upper surface of the silicon cell 374 on which the solder cream should be printed and for mounting the upper interconnectors 378 onto the portions on the silicon cell 374 on which the solder cream has been printed. When the manufacture work by the third manufacture work machine 384 is completed, the produced solar cell 372 is conveyed out of the third manufacture work machine 384. Since the motion commands in the manufacture work machines 380-384 in the present system 370 are similar to the motion commands in the manufacture work machines 270-284 in the above-described LED-lamp assembling system 250, an explanation relating to the motion commands in the present solar-cell assembling system 370 is dispensed with.

While the solar-cell assembling system 370 is constituted by the three manufacture work machines 380-384, it is possible to assemble the solar cell 372 by one manufacture work machine. In this instance, the silicon-cell supplier 388 may be attached to the first manufacture work machine 380, for instance. While production capability is low in one manufacture work machine, one manufacture work machine is sufficient at a development stage, for instance, since mass production is not necessary. Where marketing of the solar cell becomes successful and a large number of solar cells are desired to be assembled, the production capability of the solar cell can be increased by establishing the solar-cell assembling system in which three or more manufacture work machines are used.

REFERENCE SIGNS LIST

10: manufacture work machine 24: main body (base) 26: conveyor (work-element performing apparatus) 28: mounter (work head) (work-element performing apparatus) 30: supplier (component supplier) (work-element performing apparatus) 32: dispenser (work-element performing apparatus) 38: camera device (work-element performing apparatus) 40: moving device (work-element performing apparatus) 52: conveyance motor (operating device) 54: tray moving device (operating device) 58: electromagnetic motor (operating device) 60: electromagnetic motor (operating device) 62: electromagnetic motor (operating device) 72: positive/negative pressure supplier (operating device) 78: ejecting device (operating device) 90: moving-device control device (individual control device) 100: mounter control device (individual control device) 104: dispenser control device (individual control device) 108: supplier control device (individual control device) 112: conveyor control device (individual control device) 116: camera-device controller (individual control device) 130: main central control device (central control device) 134: serial communication cable (communication cable) 136: auxiliary central controller (central control device) 166: circuit substrate (first component) 169: electronic circuit component (second component) 174: work-element-performing-apparatus identifying section 176: central interface section 178: command transmission processing section (command-transmission processing step) 180: motion-command-transmission suspending section 184: source-data-input accepting section 186: source-data storage section 188: motion-command generating section (motion-command generating step) 190: central performable-motion-information storage section 192: performable-motion-information-input accepting section 210: individual interface section 212: identification-information storage section (identification information) 218: command converting section (command converting process) 220: high-frequency welder (work-element performing apparatus) 222: laser generator (work-element performing apparatus) 224: UV irradiator (work-element performing apparatus) 226: hot-air blower (work-element performing apparatus) 228: screw fastener (work-element performing apparatus) 230: screw attaching/fastening device (work-element performing apparatus) 232: double dispenser (work-element performing apparatus) 234: mounter (work-element performing apparatus) 236: solder cream printer (work-element performing apparatus) 240: tape feeder (work-element performing apparatus) 242: double conveyer (work-element performing apparatus) 250: LED-lamp assembling system (manufacture work system) 270: first manufacture work machine 272: second manufacture work machine 274: third manufacture work machine 276: fourth manufacture work machine 278: fifth manufacture work machine 280: sixth manufacture work machine 282: seventh manufacture work machine 284: eighth manufacture work machine 286: screw supplier (work-element performing apparatus) 300: power-module assembling system (manufacture work system) 330: first manufacture work machine 332: second manufacture work machine 334: third manufacture work machine 336: fourth manufacture work machine 338: fifth, manufacture work machine 340: sixth manufacture work machine 342: seventh manufacture work machine 350: bushing supplier (work-element performing apparatus) 352: lid supplier (work-element performing apparatus) 370: solar cell assembling system (manufacture work system) 380: first manufacture work machine 382: second manufacture work machine 384: third manufacture work machine

The invention claimed is:

1. A manufacture work machine for performing a manufacture work, comprising:
   a plurality of work-element performing apparatuses each configured to perform one of a plurality of work elements that constitute the manufacture work, and
   a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses, wherein
   each of the plurality of work-element performing apparatuses has (i) an individual control device configured to control an operation of a respective apparatus of the plurality of work-element performing apparatuses, and (ii) at least one operating device for performing a work element corresponding to said each of the plurality of work-element performing apparatuses,
   the individual control devices are configured to (1) recognize a matter of the motion command transmitted from the central control device for the respective work-element performing apparatus to be operated by the motion command, and (2) to control an operation of the at least one operating device of the respective work-element performing apparatus so as to permit the respective work-element performing apparatus to which the individual control device belongs to perform one motion corresponding to the motion command,
   at least one of the individual control devices cannot use the motion command to control operation of the at least one operating device of the respective work-element performing apparatus to be operated by the motion command, but is configured to translate the motion command to a modified motion command that is used to control operation of the at least one operating device of the respective work-element performing apparatus,
   the manufacture work machine is an assembling work machine configured to assemble a plurality of components into an assembled article,
   the motion command designates the one of the work-element performing apparatuses to be operated by the motion command,
   each of the plurality of motion commands is transmitted to each of the plurality of work-element performing apparatuses without specifying a destination apparatus of the respective motion command,
   each of the work-element performing apparatuses possesses, in a storage of the individual control device, identification information for identification of the respective work-element performing apparatus, and the individual control device is configured to transmit the identification information to the central control device,
   the central control device judges, on the basis of the identification information transmitted from the individual control device of each of the work-element performing apparatuses, whether a motion command can be transmitted to each of the work-element performing apparatuses
   the plurality of work-element performing apparatuses include different types of apparatuses, including:
      a conveyor configured to perform conveyance of at least one of a first component which is one of a plurality of components and the assembled article, as one of the plurality of work elements,
      a component supplier configured to perform supply of a second component which is the other one of the plurality of components, as another one of the plurality of work elements, and
      a work head configured to perform a motion necessary for assembling the second component to the first component, as still another one of the plurality of work elements,
   the central control device is configured, based on a judgment by the central control device that the motion command can be transmitted, to transmit to the conveyor, the component supplier, and the work head, the motion command in a format designated for the respective apparatus,
   the central control device includes:
      a source-data storage section configured to store source data in which is encoded a matter of each of the plurality of work elements to be performed by each of the plurality of work-element performing apparatuses to perform the manufacture work,
      a motion-command generating section configured to generate the plurality of motion commands on the basis of the source data,
      a command-transmission processing section configured to perform transmission processing to transmit the plurality of motion commands generated by the motion-command generating section to the plurality of work-element performing apparatuses, and
      a source-data-input accepting section configured to accept input of the source data to be stored in the source-data storage section, from an exterior, and
   each of the work-element performing apparatuses is replaceable by another work-element performing apparatus of a different type based on rewritten source data in accordance with a change of the manufacture work.

2. The manufacture work machine according to claim 1,
wherein the central control device is configured to transmit a motion command in a specific programming language, and
wherein the individual control device of at least one of the plurality of work-element performing apparatuses includes a command converting section configured to convert the motion command transmitted from the central control device into a motion command in a programming language by which the individual control device can recognize a matter of the motion command.

3. The manufacture work machine according to claim 1,
wherein the central control device includes a central interface section for transmitting, according to one protocol, a motion command to each of the plurality of work-element performing apparatuses, and
wherein the individual control device includes an individual interface section for receiving, according to the one protocol, the motion command transmitted from the central control device.

4. The manufacture work machine according to claim 1, wherein the individual control device is configured to transmit, to the central control device, a reply as to termination of one motion that is being performed by one of the plurality of work-element performing apparatuses that is controlled by the individual control device on the basis of one motion command.

5. The manufacture work machine according to claim 4, wherein the central control device is configured to transmit a motion command that is to be transmitted subsequent to the one motion command, after having received the reply as to termination of the one motion.

6. The manufacture work machine according to claim 1, wherein the central control device includes a motion-command-transmission suspending section configured to suspend transmission of the motion command to the individual control device of one of the plurality of work-element performing apparatuses where the one of the plurality of work-element performing apparatuses does not operate normally.

7. The manufacture work machine according to claim 1, wherein each of the motion commands includes, as an associated command, a motion parameter for one motion to be performed by the respective work-element performing apparatus to be operated by the motion command.

8. A manufacture work machine for performing a manufacture work, comprising:
a plurality of work-element performing apparatuses each configured to perform one of a plurality of work elements that constitute the manufacture work, and
a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses, wherein
each of the plurality of work-element performing apparatuses has (i) an individual control device configured to control an operation of a respective apparatus of the plurality of work-element performing apparatuses, and (ii) at least one operating device for performing a work element corresponding to said each of the plurality of work-element performing apparatuses,
the individual control devices are configured to (1) recognize a matter of the motion command transmitted from the central control device for the respective work-element performing apparatus to be operated by the motion command, and (2) to control an operation of the at least one operating device of the respective work-element performing apparatus so as to permit the respective work-element performing apparatus to which the individual control device belongs to perform one motion corresponding to the motion command,
the manufacture work machine is an assembling work machine configured to assemble a plurality of components into an assembled article,
the central control device is configured, based on a judgment by the central control device that the motion command can be transmitted, to transmit to the conveyor, the component supplier, and the work head, the motion command in a format designated for the respective apparatus,
the motion command designates the one of the work-element performing apparatuses to be operated by the motion command,
each of the plurality of motion commands is transmitted to each of the plurality of work-element performing apparatuses without specifying a destination apparatus of the respective motion command,
each of the work-element performing apparatuses possesses, in a storage of the individual control device, identification information for identification of the respective work-element performing apparatus, and the individual control device is configured to transmit the identification information to the central control device,
the central control device judges, on the basis of the identification information transmitted from the individual control device of each of the work-element performing apparatuses, whether a motion command can be transmitted to each of the work-element performing apparatuses,
the plurality of work-element performing apparatuses include different types of apparatuses, including:
a conveyor configured to perform conveyance of at least one of a first component which is one of a plurality of components and the assembled article, as one of the plurality of work elements,
a component supplier configured to perform supply of a second component which is the other one of the plurality of components, as another one of the plurality of work elements, and
a work head configured to perform a motion necessary for assembling the second component to the first component, as still another one of the plurality of work elements,
the central control device is configured to transmit, to the conveyor, the component supplier, and the work head, the motion command in a format common to the conveyor, the component supplier, and the work head,
the central control device includes:
a source-data storage section configured to store source data in which is encoded a matter of each of the plurality of work elements to be performed by each of the plurality of work-element performing apparatuses to perform the manufacture work,
a motion-command generating section configured to generate the plurality of motion commands on the basis of the source data,
a command-transmission processing section configured to perform transmission processing to transmit the plurality of motion commands generated by the motion-command generating section to the plurality of work-element performing apparatuses, and a source-data-input accepting section configured to accept input of the source data to be stored in the source-data storage section, from an exterior, and each of the work-element performing apparatuses is replaceable by another work-element performing apparatus of a different type based on rewritten source data in accordance with a change of the manufacture work.

9. The manufacture work machine according to claim 8, wherein each of the motion commands includes, as an associated command, a motion parameter for one motion to be performed by the respective work-element performing apparatus to be operated by the motion command.

10. A manufacture work machine for performing a manufacture work, comprising:

a plurality of work-element performing apparatuses each configured to perform one of a plurality of work elements that constitute the manufacture work, and a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses, wherein each of the plurality of work-element performing apparatuses has (i) an individual control device configured to control an operation of a respective apparatus of the plurality of work-element performing apparatuses, and (ii) at least one operating device for performing a work element corresponding to said each of the plurality of work-element performing apparatuses, the individual control devices are configured to (1) recognize a matter of the motion command transmitted from the central control device for the respective work-element performing apparatus to be operated by the motion command, and (2) to control an operation of the at least one operating device of the respective work-element performing apparatus so as to permit the respective work-element performing apparatus to which the individual control device belongs to perform one motion corresponding to the motion command, at least one of the individual control devices cannot use the motion command to control operation of the at least one operating device of the respective work-element performing apparatus to be operated by the motion command, but is configured to translate the motion command to a modified motion command that is used to control operation of the at least one operating device of the respective work-element performing apparatus, the manufacture work machine is an assembling work machine configured to assemble a plurality of components into an assembled article, the plurality of work-element performing apparatuses include different types of apparatuses, including:

a conveyor configured to perform conveyance of at least one of a first component which is one of a plurality of components and the assembled article, as one of the plurality of work elements, a component supplier configured to perform supply of a second component which is the other one of the plurality of components, as another one of the plurality of work elements, and a work head configured to perform a motion necessary for assembling the second component to the first component, as still another one of the plurality of work elements, the central control device is configured, based on a judgment by the central control device that the motion command can be transmitted, to transmit to the conveyor, the component supplier, and the work head, the motion command in a format designated for the respective apparatus, the central control device includes:

a source-data storage section configured to store source data in which is encoded a matter of each of the plurality of work elements to be performed by each of the plurality of work-element performing apparatuses to perform the manufacture work, a motion-command generating section configured to generate the plurality of motion commands on the basis of the source data, a command-transmission processing section configured to perform transmission processing to transmit the plurality of motion commands generated by the motion-command generating section to the plurality of work-element performing apparatuses, and a source-data-input accepting section configured to accept input of the source data to be stored in the source-data storage section, from an exterior, and each of the work-element performing apparatuses is replaceable by another work-element performing apparatus of a different type based on rewritten source data in accordance with a change of the manufacture work.

\* \* \* \* \*